(12) United States Patent
Huang et al.

(10) Patent No.: US 9,887,274 B2
(45) Date of Patent: Feb. 6, 2018

(54) FINFETS AND METHODS FOR FORMING THE SAME

(71) Applicant: Taiwan Semiconductor Manufacturing Company, Ltd., Hsin-Chu (TW)

(72) Inventors: Yu-Lien Huang, Jhubei (TW); Chun-Hsiang Fan, Hsin-Chu (TW); Tsu-Hsiu Perng, Zhubei (TW); Chi-Kang Liu, Taipei (TW); Yung-Ta Li, Kaohsiung (TW); Ming-Huan Tsai, Zhubei (TW); Clement Hsingjen Wann, Carmel, NY (US); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/144,360

(22) Filed: May 2, 2016

(65) Prior Publication Data
US 2016/0247900 A1   Aug. 25, 2016

Related U.S. Application Data

(60) Continuation of application No. 14/625,848, filed on Feb. 19, 2015, now Pat. No. 9,349,841, which is a
(Continued)

(51) Int. Cl.
*H01L 29/66* (2006.01)
*H01L 29/78* (2006.01)
(Continued)

(52) U.S. Cl.
CPC .. *H01L 29/66795* (2013.01); *H01L 21/30604* (2013.01); *H01L 21/3247* (2013.01);
(Continued)

(58) Field of Classification Search
None
See application file for complete search history.

(56) References Cited

U.S. PATENT DOCUMENTS 7,385,247 B2   6/2008   Rhee et al.
8,049,286 B2   11/2011  Tateshita
(Continued)

FOREIGN PATENT DOCUMENTS

KR   1020080099798   11/2008
KR    100879653      1/2009

OTHER PUBLICATIONS

Korean Office Action and English Translation, Application No. 10-2013-0064862, 9 pages.
(Continued)

*Primary Examiner* — Fazli Erdem
(74) *Attorney, Agent, or Firm* — Slater Matsil, LLP

(57) ABSTRACT

A FinFET and methods for forming a FinFET are disclosed. A method includes forming trenches in a semiconductor substrate to form a fin, depositing an insulating material within the trenches, and removing a portion of the insulating material to expose sidewalls of the fin. The method also includes recessing a portion of the exposed sidewalls of the fin to form multiple recessed surfaces on the exposed sidewalls of the fin, wherein adjacent recessed surfaces of the multiple recessed surfaces are separated by a lattice shift. The method also includes depositing a gate dielectric on the recessed portion of the sidewalls of the fin and depositing a gate electrode on the gate dielectric.

20 Claims, 23 Drawing Sheets

Related U.S. Application Data division of application No. 13/779,356, filed on Feb. 27, 2013, now Pat. No. 8,987,791.

(51) Int. Cl.
*H01L 29/34* (2006.01)
*H01L 21/306* (2006.01)
*H01L 21/324* (2006.01)
*H01L 29/06* (2006.01)

(52) U.S. Cl.
CPC .......... *H01L 29/0653* (2013.01); *H01L 29/34* (2013.01); *H01L 29/6681* (2013.01); *H01L 29/66545* (2013.01); *H01L 29/7853* (2013.01)

(56) References Cited

U.S. PATENT DOCUMENTS

| | | | |
|---|---|---|---|
| 8,658,505 | B2 | 2/2014 | Cai et al. |
| 8,759,943 | B2 | 6/2014 | Tseng et al. |
| 8,987,791 | B2 | 3/2015 | Huang et al. |
| 9,054,018 | B2 | 6/2015 | Ma et al. |
| 2005/0156202 | A1 | 7/2005 | Rhee et al. |
| 2006/0046388 | A1 | 3/2006 | Park et al. |
| 2006/0086977 | A1 | 4/2006 | Shah et al. |
| 2006/0160302 | A1 | 7/2006 | Kim et al. |
| 2007/0001173 | A1 | 1/2007 | Brask et al. |
| 2007/0145487 | A1 | 6/2007 | Kavalieros et al. |
| 2007/0231997 | A1 | 10/2007 | Doyle et al. |
| 2008/0277740 | A1 | 11/2008 | Tateshita |
| 2011/0079852 | A1* | 4/2011 | Lander .............. H01L 29/66795 257/347 |
| 2011/0097889 | A1* | 4/2011 | Yuan ................. H01L 21/76224 438/595 |
| 2011/0147842 | A1 | 6/2011 | Cappellani et al. |
| 2012/0012932 | A1* | 1/2012 | Perng ................... H01L 29/165 257/347 |
| 2012/0086053 | A1* | 4/2012 | Tseng ................ H01L 29/66795 257/288 |
| 2012/0199888 | A1 | 8/2012 | Dai et al. |
| 2012/0299099 | A1* | 11/2012 | Huang ............... H01L 29/66795 257/347 |
| 2013/0049068 | A1 | 2/2013 | Lin et al. |
| 2013/0093026 | A1 | 4/2013 | Wann et al. |
| 2013/0105860 | A1 | 5/2013 | Lochteeld et al. |
| 2013/0200470 | A1* | 8/2013 | Liu .................... H01L 29/66795 257/408 |
| 2013/0221448 | A1* | 8/2013 | Chang .................... H01L 29/06 257/401 |
| 2013/0234147 | A1 | 9/2013 | Wu et al. |
| 2014/0084351 | A1 | 3/2014 | Huang et al. |
| 2014/0117419 | A1* | 5/2014 | Juengling ......... H01L 21/82343 257/288 |
| 2014/0145242 | A1 | 5/2014 | Huang et al. |
| 2014/0175561 | A1 | 6/2014 | Colinge et al. |
| 2014/0217362 | A1 | 8/2014 | Ma et al. |
| 2014/0225065 | A1 | 8/2014 | Rachmady et al. |
| 2014/0239354 | A1 | 8/2014 | Huang et al. |
| 2014/0299923 | A1 | 10/2014 | Chang |
| 2014/0361336 | A1 | 12/2014 | Chen et al. |
| 2015/0031182 | A1* | 1/2015 | Perng ................... H01L 29/165 438/283 |
| 2015/0102386 | A1 | 4/2015 | Chen et al. |
| 2015/0132911 | A1 | 5/2015 | Wann et al. |
| 2015/0171187 | A1 | 6/2015 | Huang |
| 2015/0228794 | A1 | 8/2015 | Hsiao et al. |
| 2015/0263003 | A1 | 9/2015 | Lee et al. |
| 2017/0125307 | A1 | 5/2017 | Lee et al. |

OTHER PUBLICATIONS

Ohmi, T., et al., "Science-based New Silicon Technologies Exhibiting Super High Performance due to Radical-reaction-based Semiconductor Manufacturing," Journal of the Korean Physical Society, vol. 59, No. 2, Aug. 2011, pp. 391-401.

* cited by examiner

FINFETS AND METHODS FOR FORMING THE SAME

PRIORITY CLAIM AND CROSS-REFERENCE

This application is a continuation of U.S. patent application Ser. No. 14/625,848, filed Feb. 19, 2015, entitled "FinFETs and Methods for Forming the Same," which is a divisional of U.S. patent application Ser. No. 13/779,356, now U.S. Pat. No. 8,987,791, filed Feb. 27, 2013, entitled "FinFETs and Methods for Forming the Same," which applications are hereby incorporated herein by reference in their entirety.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (finFETs) have been studied to overcome some of these problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
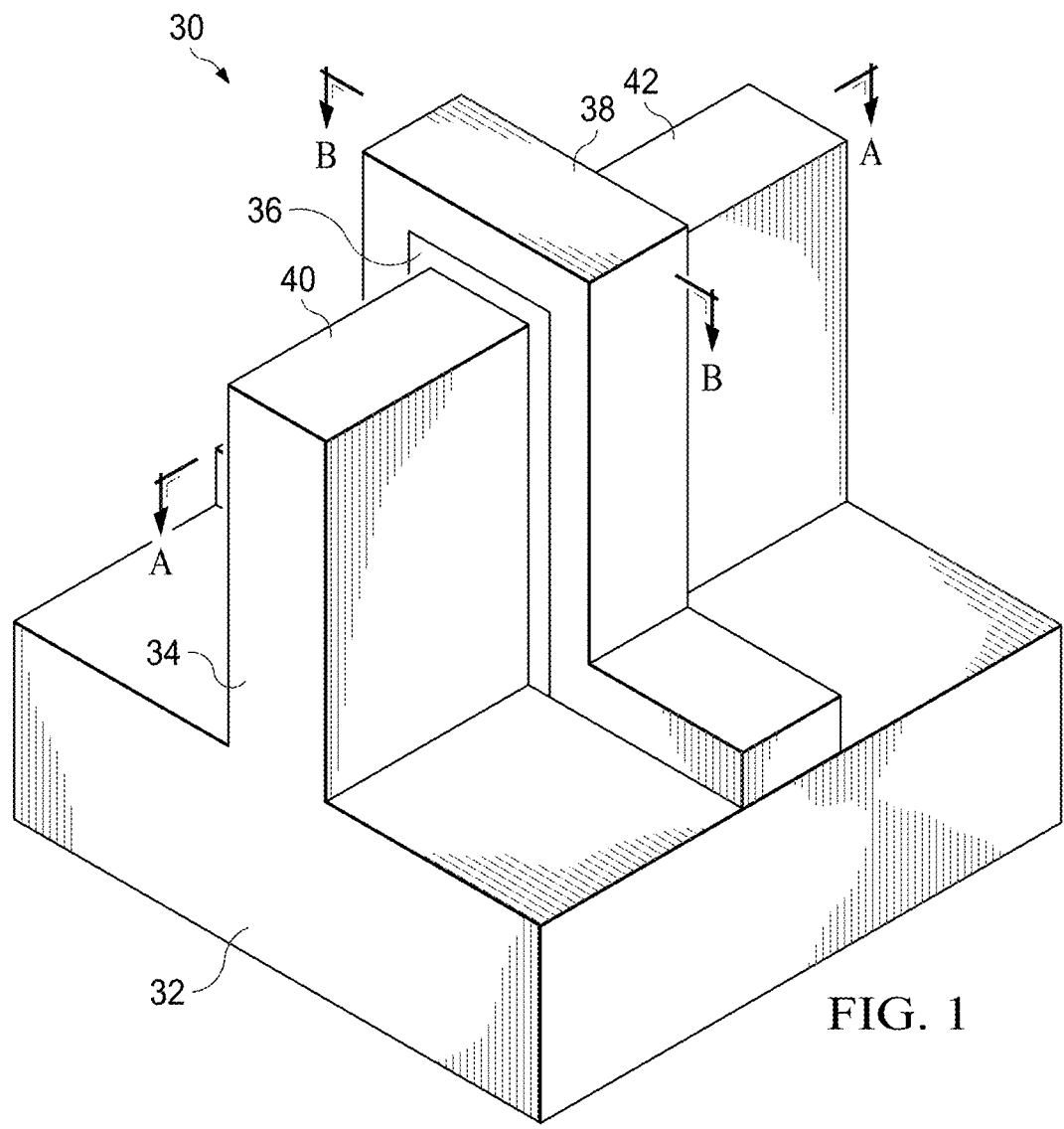
FIG. 1 is an example of a fin field-effect transistor (finFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Fin Field-Effect Transistors (finFETs) and methods of forming the same are provided in accordance with various embodiments. The intermediate stages of forming the finFETs are illustrated. Some variations of the embodiments are discussed. Throughout the various views and illustrative embodiments, like reference numbers are used to designate like elements. Although method embodiments are discussed in a particular order, various other method embodiments may be performed in any logical order and may include fewer or more steps described herein.

FIG. 1 illustrates an example of a finFET 30 in a three-dimensional view. The finFET 30 comprises a fin 34 on a substrate 32. A gate dielectric 36 is along sidewalls and over a top surface of the fin 34, and a gate electrode 38 is over the gate dielectric 36. Source/drain regions 40 and 42 are disposed in opposite sides of the fin 34 with respect to the gate dielectric 36 and gate electrode 38. FIG. 1 further illustrates reference cross-sections that are used in later figures. Cross-section A-A is along a longitudinal axis of the fin 34 and in a direction of, for example, a current flow between the source/drain regions 40 and 42. Cross-section B-B is perpendicular to cross-section A-A and is across a channel, gate dielectric 36, and gate electrode 38 of the finFET 30.

Figure 13A:
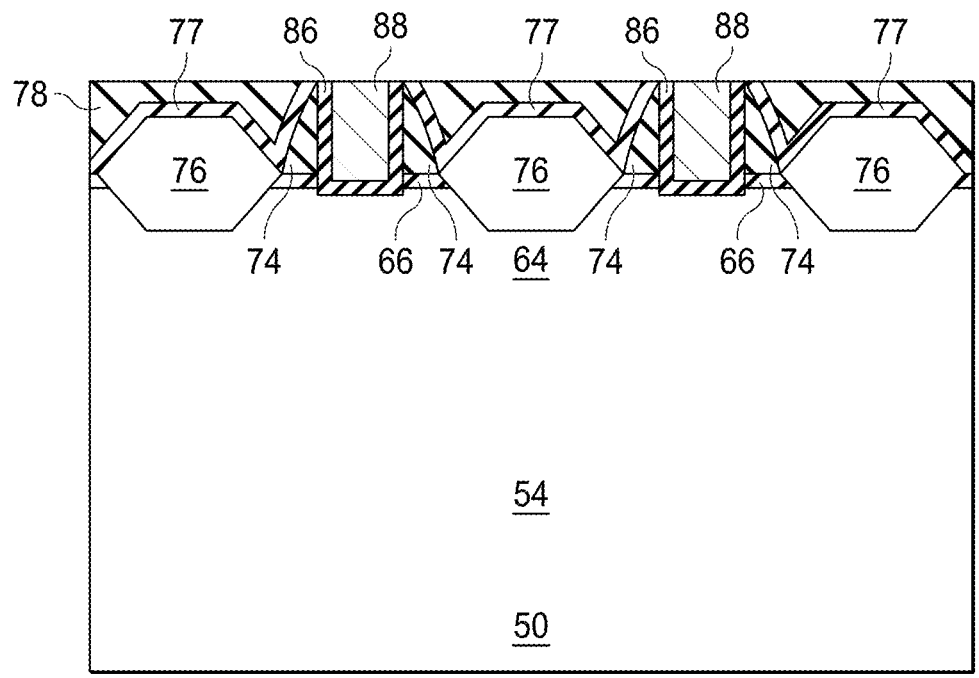
Figure 13B:
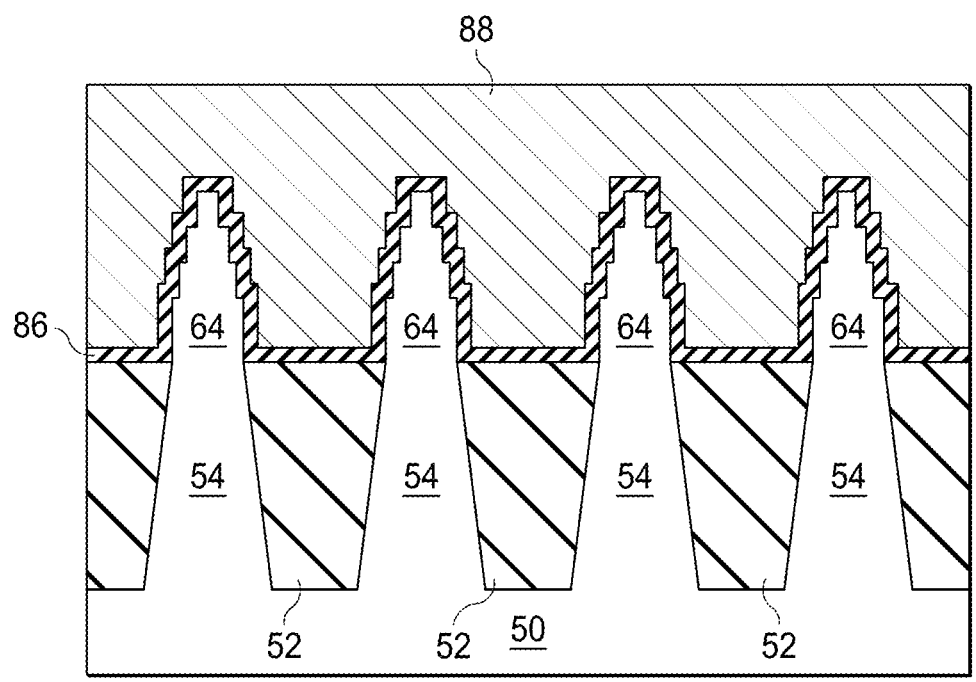
Figure 14:
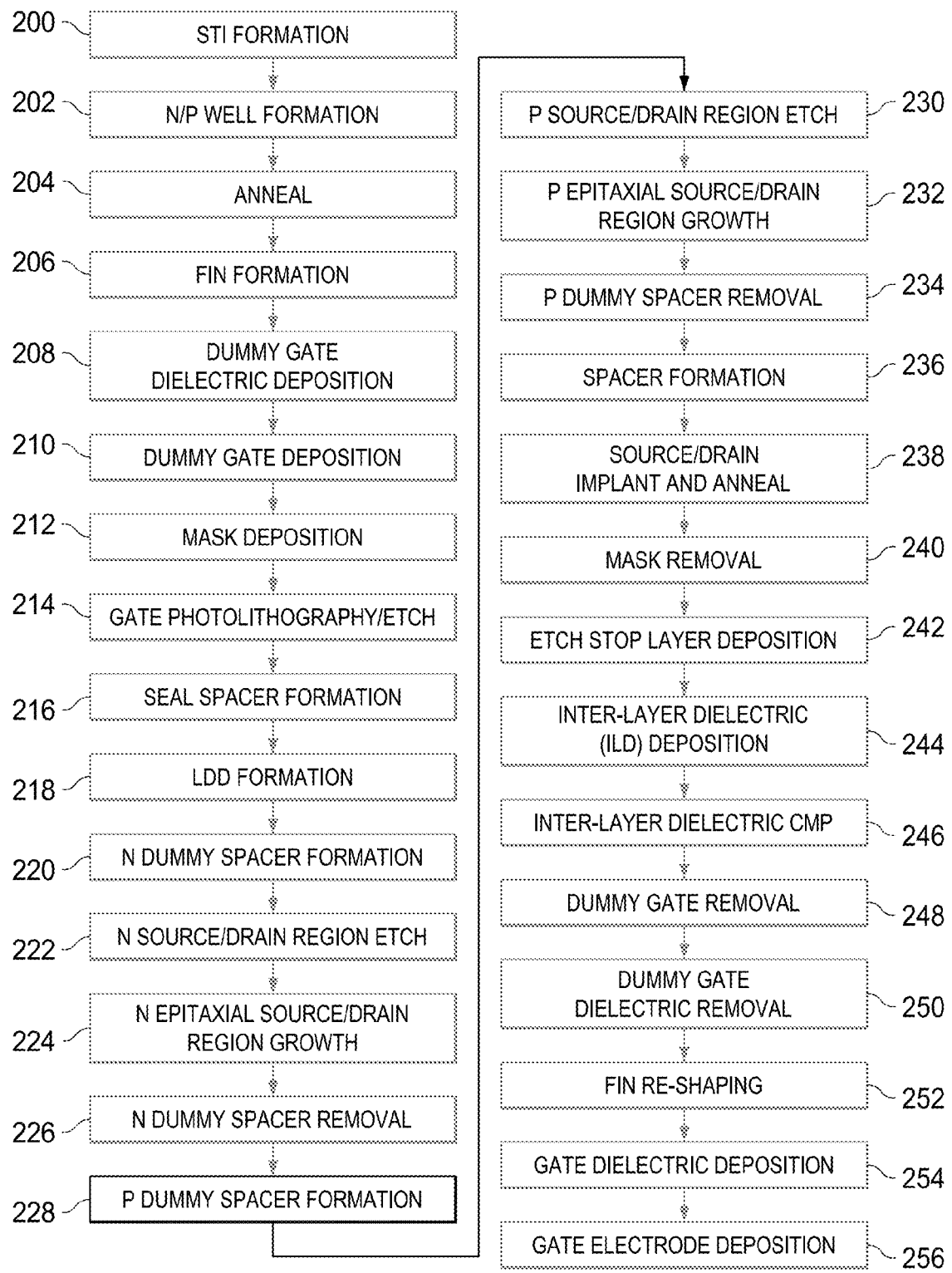
FIG. 14 is a process flow of the process shown in FIGS. 2 through 13B in accordance with an exemplary embodiment.

FIGS. 2 through 13B are cross-sectional views of intermediate stages in the manufacturing of a finFET in accordance with an exemplary embodiment, and FIG. 14 is a process flow of the process shown in FIGS. 2 through 13B. FIGS. 2 through 5 illustrate cross-section B-B illustrated in FIG. 1, except for multiple finFETs. In FIGS. 6A through 13B, figures ending with an "A" designation are illustrated along a similar cross-section A-A, and figures ending with a "B" designation are illustrated along a similar cross-section B-B.

Figure 2:
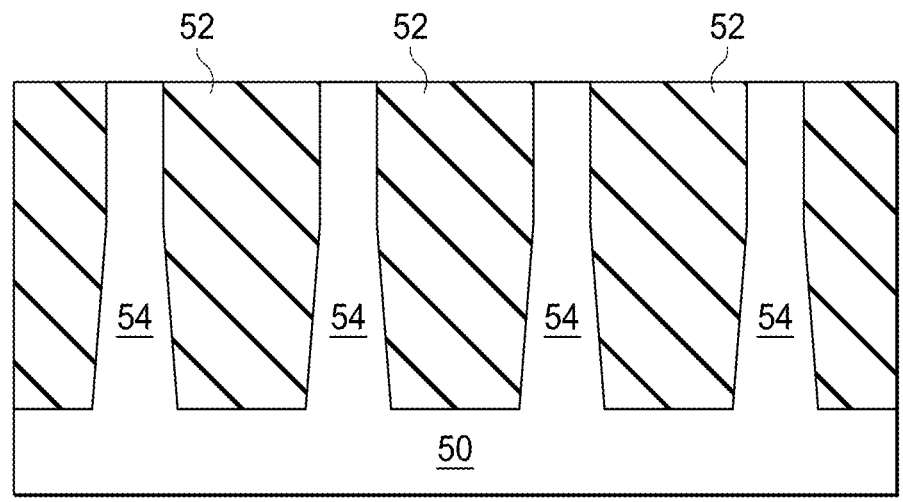
FIGS. 2, 3, 4, 5, 6A, 6B, 7A, 7B, 8A, 8B, 9A, 9B, 10A, 10B, 11A, 11B, 12A, 12B, 13A, and 13B are cross-sectional views of intermediate stages in the manufacturing of a finFET in accordance with an exemplary embodiment.

FIG. 2 illustrates a substrate 50, which may be a part of a wafer. Substrate 50 may be a semiconductor substrate, which may further be a silicon substrate, a silicon carbon substrate, a silicon germanium substrate, or a substrate formed of other semiconductor materials. The substrate 50 may be a bulk substrate, a semiconductor-on-insulator (SOI) substrate, or other acceptable substrates. The substrate 50 may be lightly doped with a p-type or an n-type impurity.

Isolation regions 52 are formed (step 200), which extend from a top surface of substrate 50 into substrate 50. Isolation regions 52 may be Shallow Trench Isolation (STI) regions, and are referred to as STI regions 52 hereinafter. The formation of STI regions 52 may include etching the substrate 50 to form trenches (not shown), and filling the trenches with a dielectric material to form STI regions 52. STI regions 52 may be formed of silicon oxide deposited by a high density plasma, for example, although other dielectric materials formed according to various techniques may also be used. The portion of substrate 50 between neighboring STI regions 52 is referred to as a semiconductor strip 54 throughout the description. The top surfaces of the semiconductor strips 54 and the top surfaces of STI regions 52 may be substantially level with each other, such as by performing a chemical mechanical polish (CMP) after depositing the material of the STI regions 52, although the surfaces may be at slightly different levels.

Figure 3:
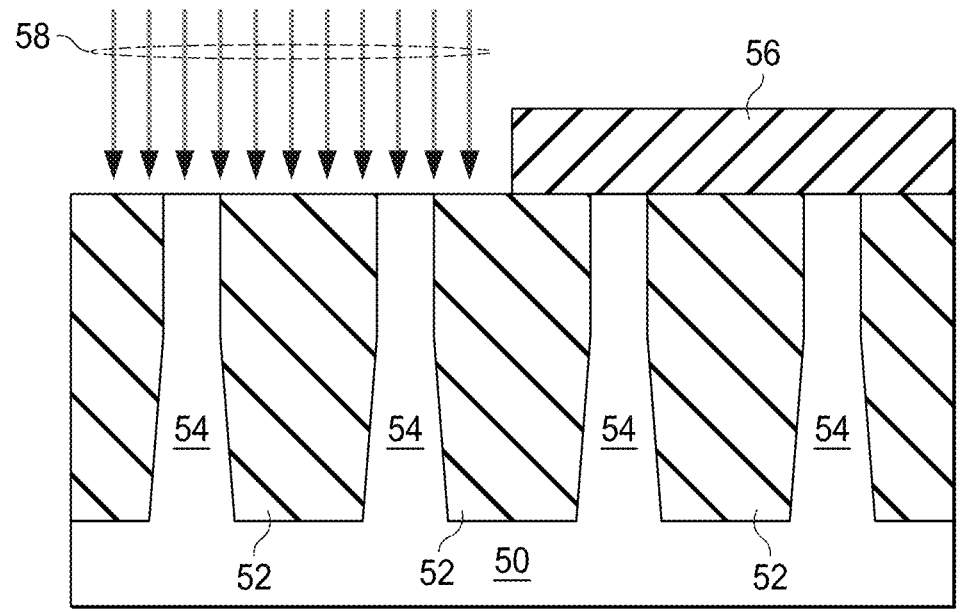
Figure 4:
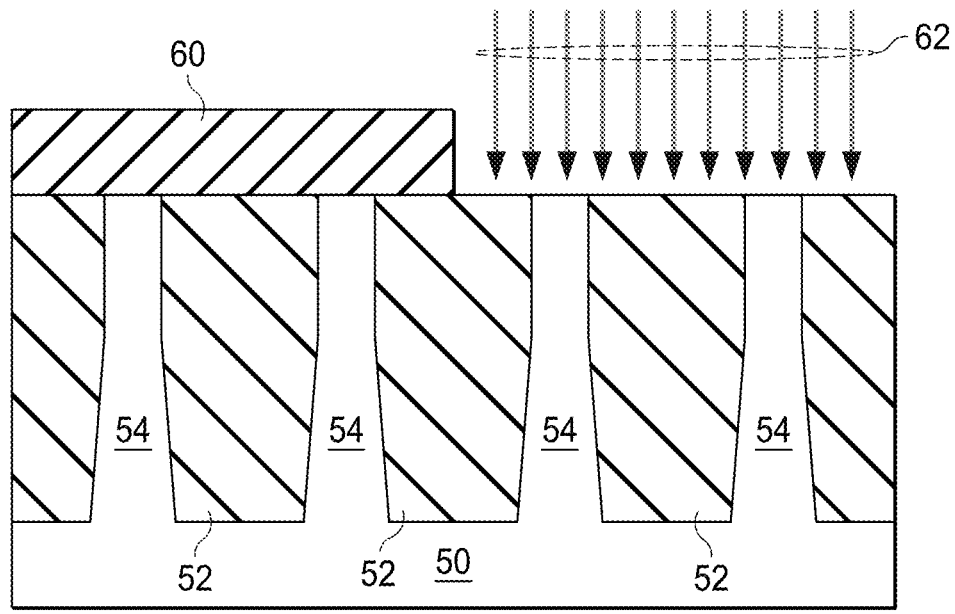

FIGS. 3 and 4 illustrate the formation of a P well in a first region and an N well in a second region (step 202). Referring to FIG. 3, a first photoresist 56 is formed over the semiconductor strips 54 and the STI regions 52 in the substrate 50. The first photoresist 56 is patterned to expose a first region of the substrate 50, such as an NMOS region. The first photoresist 56 can be formed by using a spin-on technique and can be patterned using acceptable photolithography techniques. Once the first photoresist 56 is patterned, a p-type impurity implant 58 is performed in the first region, and the first photoresist 56 may act as a mask to substantially prevent p-type impurities from being implanted into a second region, such as a PMOS region. The p-type impurities may be boron, $BF_2$, or the like implanted in the first region to a concentration of equal to or less than $10^{18}$ cm$^{-3}$, such as between about $10^{17}$ cm$^{-3}$ and about $10^{18}$ cm$^{-3}$. After the implant 58, the first photoresist 56 may be removed, such as by an acceptable ashing process.

Referring to FIG. 4, a second photoresist 60 is formed over the semiconductor strips 54 and the STI regions 52 in the substrate 50. The second photoresist 60 is patterned to expose a second region of the substrate 50, such as the PMOS region. The second photoresist 60 can be formed by using a spin-on technique and can be patterned using acceptable photolithography techniques. Once the second photoresist 60 is patterned, an n-type impurity implant 62 is performed in the second region, and the second photoresist 60 may act as a mask to substantially prevent n-type impurities from being implanted into the first region, such as the NMOS region. The n-type impurities may be phosphorus, arsenic, or the like implanted in the first region to a concentration of equal to or less than $10^{18}$ cm$^{-3}$, such as between about $10^{17}$ cm$^{-3}$ and about $10^{18}$ cm$^{-3}$. After the implant 62, the second photoresist 60 may be removed, such as by an acceptable ashing process.

After the implants in FIGS. 3 and 4, an anneal may be performed (step 204) to activate the p-type and n-type impurities that were implanted. The implantations may form a p-well in the NMOS region and an n-well in the PMOS region.

Figure 5:
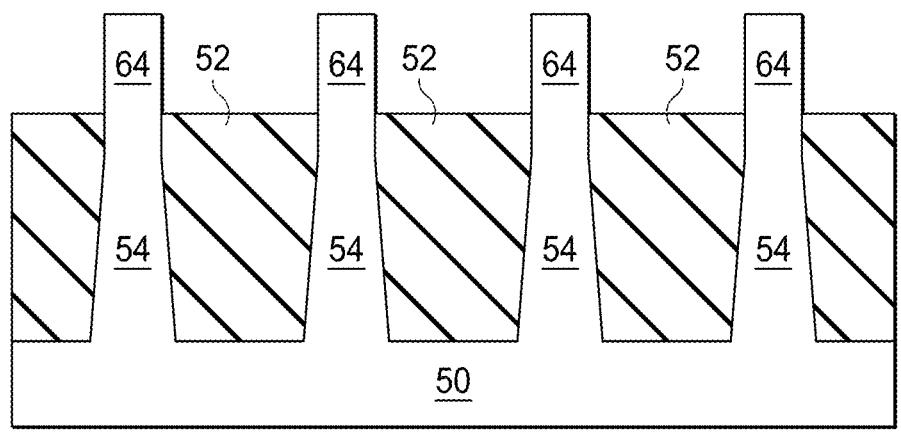

In FIG. 5, the STI regions 52 are recessed such that respective fins 64 protrude from between neighboring STI regions 52 to form the fins 64 (step 206). The STI regions 52 may be recessed using an acceptable etching process, such as one that is selective to the material of the STI regions 52. For example, a chemical oxide removal using a Tokyo Electron CERTAS or an Applied Materials SICONI tool or dilute hydrofluoric acid may be used.

A person having ordinary skill in the art will readily understand that the process described with respect to FIGS. 2 through 5 is just one example of how fins 64 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 54 in FIG. 2 can be recessed, and a material different from the semiconductor strips 54 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate the implantations discussed in FIGS. 3 and 4 although in situ and implantation doping may be used together. Still further, it may be advantageous to epitaxially grow a material in the NMOS region different from the material in the PMOS region. In various embodiments, the fins 64 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
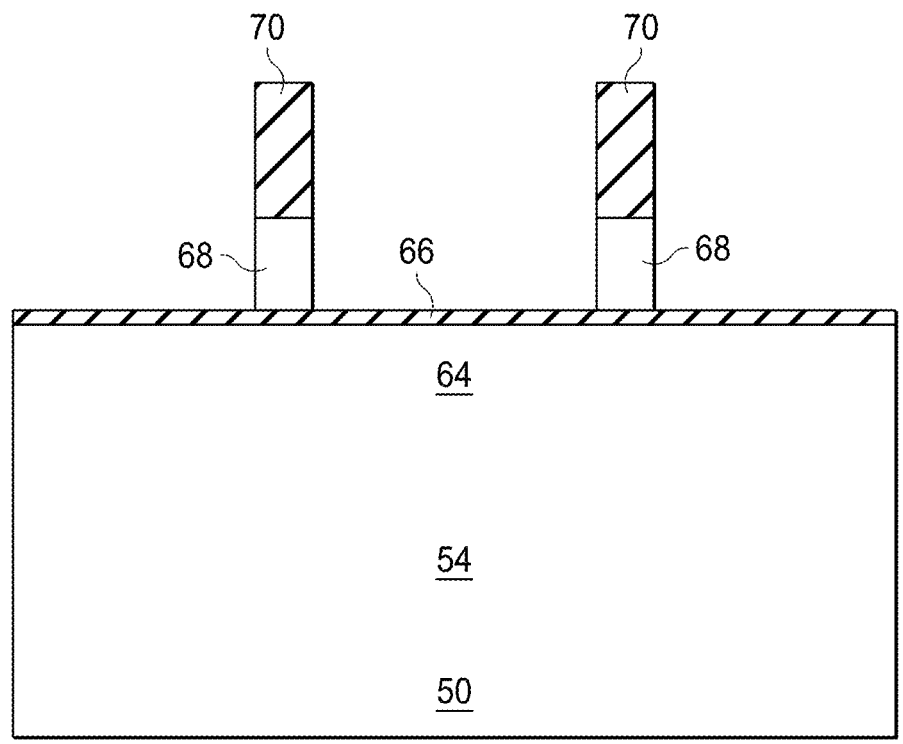
Figure 6B:
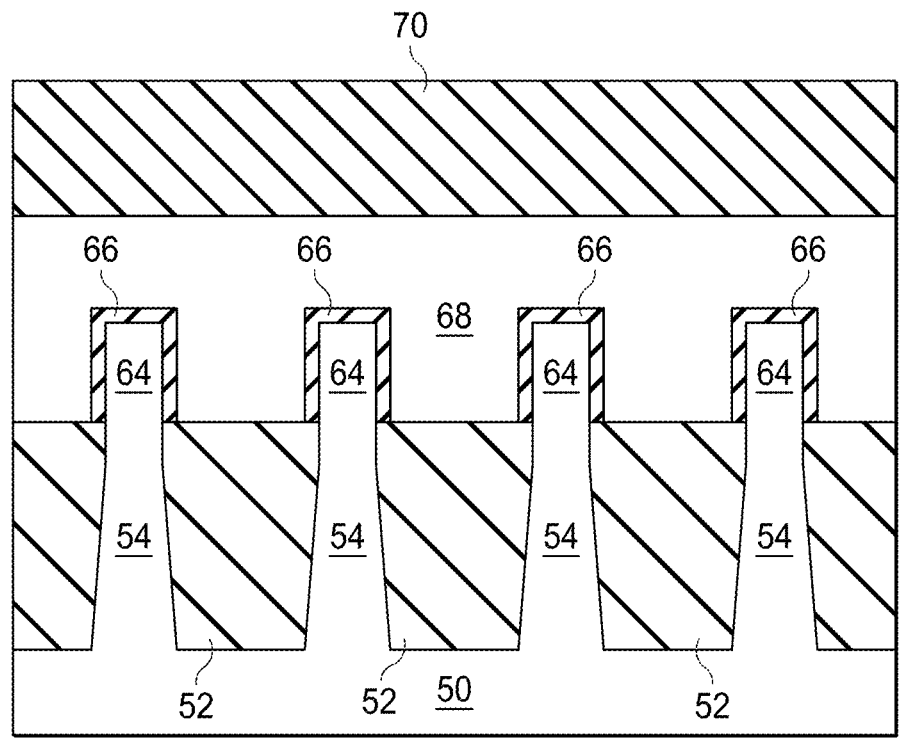

Referring to FIGS. 6A and 6B, a dummy gate dielectric layer 66 is formed (step 208) on the fins 64. The dummy gate dielectric layer 66 may be, for example, silicon oxide, silicon nitride, a combination thereof, or the like, and may be deposited or thermally grown according to acceptable techniques. Dummy gates 68 are formed over the dummy gate dielectric layer 66, and masks 70 are formed over the dummy gates 68. A material of the dummy gates 68 may be deposited (step 210) over the dummy gate dielectric layer 66 and then planarized, such as by a CMP. A material of the masks 70 may be deposited (step 212) over the layer of the dummy gates 68. The material of the masks 70 then may be patterned using acceptable photolithography and etching techniques. The pattern of the masks 70 then may be transferred to the material of the dummy gates 68 by an acceptable etching technique. These photolithography and etching techniques may form the dummy gates 68 and masks 70 (step 214). Dummy gates 68 may be formed of, for example, polysilicon, although other materials that have a high etching selectivity from the etching of STI regions 52 may also be used. The masks 70 may be formed of, for example, silicon nitride or the like. The dummy gates 68 cover respective channel regions of the fin 64. The dummy gates 68 may also have a lengthwise direction substantially perpendicular to the lengthwise direction of respective fins 64.

Figure 7A:
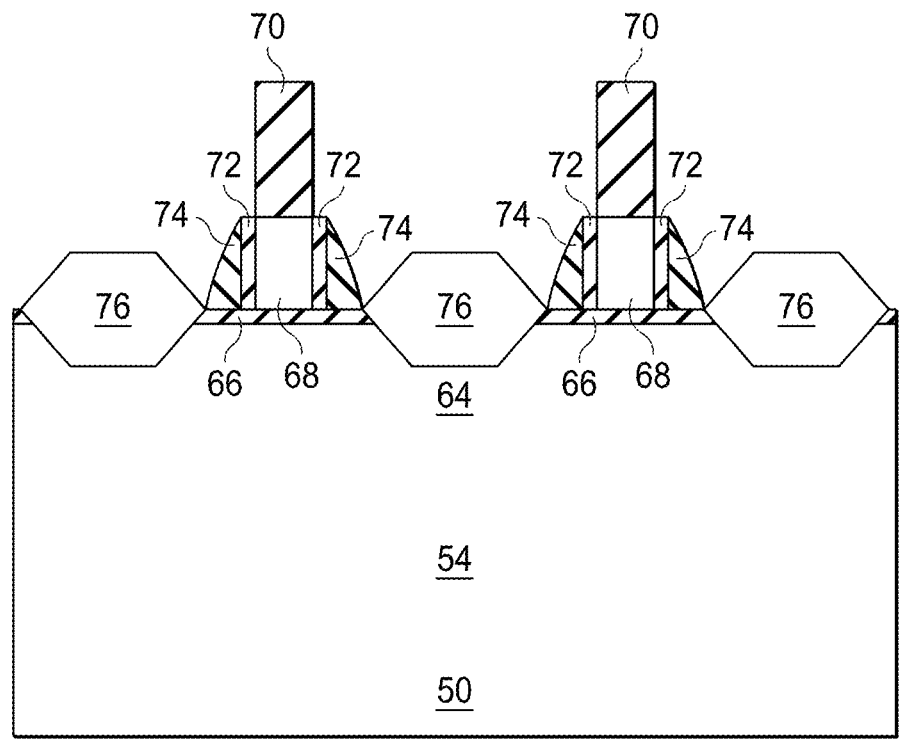
Figure 7B:
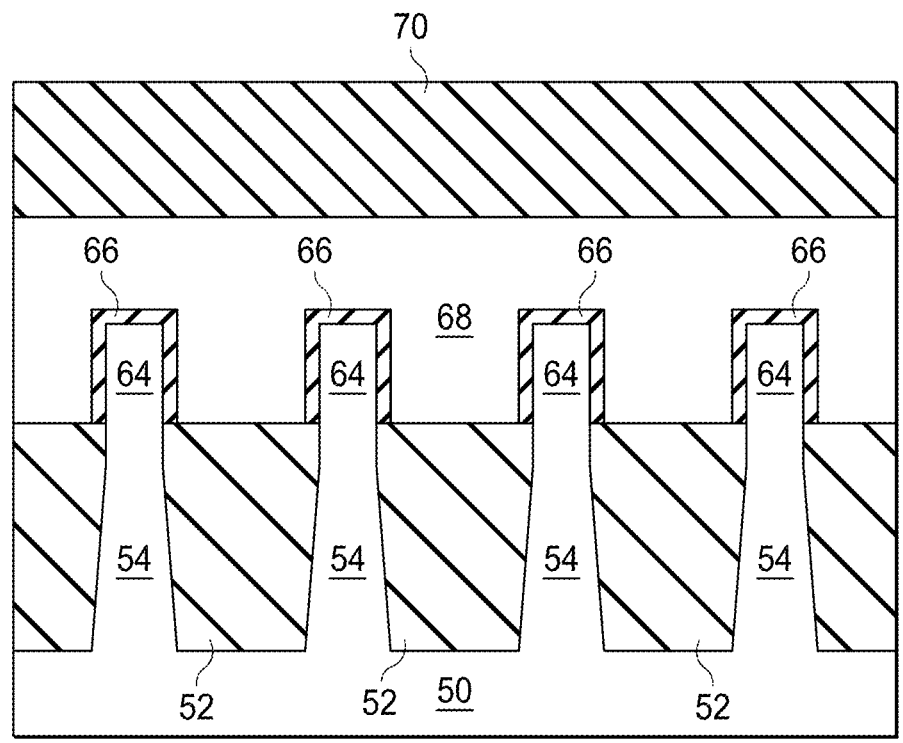

Referring to FIGS. 7A and 7B, gate seal spacers 72 can be formed (step 216) on exposed surfaces of respective dummy gates 68. A thermal oxidation or a deposition followed by an anisotropic etch may form the gate seal spacers 72. Implants for lightly doped source/drain (LDD) regions may be performed (step 218). Similar to FIGS. 3 and 4, a mask may be formed over the PMOS region while exposing the NMOS region, and n-type impurities may be implanted into the exposed fins 64. The mask may then be removed. Subsequently, a mask may be formed over the NMOS region while exposing the PMOS region, and p-type impurities may be implanted into the exposed fins 64. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may activate the implanted impurities.

Epitaxial source/drain regions 76 are formed in the fins 64, wherein each dummy gate 68 is disposed between respective neighboring pairs of the epitaxial source/drain regions 76. Epitaxial source/drain regions 76 in the NMOS region may be formed by masking the PMOS region and conformally depositing a dummy spacer layer in the NMOS region followed by an anisotropic etch to form dummy gate spacers (step 220) (not shown in FIGS. 7A and 7B) along sidewalls of the dummy gates 68 in the NMOS region. Then, source/drain regions of the fins 64 in the NMOS region are etched (step 222) to form recesses. The epitaxial source/drain regions 76 in the NMOS region are epitaxially grown (step 224) in the recesses. The epitaxial source/drain regions 76 may comprise any material appropriate for n-type finFETs. For example, if the fin is silicon, the epitaxial source/drain regions 76 may comprise silicon, SiC, SiCP, or the like. The epitaxial source/drain regions 76 may have surfaces raised from respective surfaces of the fins 64 and may have facets. Subsequently, the dummy gate spacers in the NMOS region are removed (step 226), for example, by an etch, as is the mask on the PMOS region.

Epitaxial source/drain regions 76 in the PMOS region may be formed by masking the NMOS region and conformally depositing a dummy spacer layer in the PMOS region followed by an anisotropic etch to form dummy gate spacers (step 228) (not shown in FIGS. 7A and 7B) along sidewalls of the dummy gates 68 in the PMOS region. Then, source/drain regions of the fins 64 in the PMOS region are etched (step 230) to form recesses. The epitaxial source/drain regions 76 in the PMOS region are epitaxially grown (step 232) in the recesses. The epitaxial source/drain regions 76 may comprise any material appropriate for p-type finFETs. For example, if the fin is silicon, the epitaxial source/drain regions 76 may comprise SiGe$_x$, SiGe$_x$B, or the like. The epitaxial source/drain regions 76 may have surfaces raised from respective surfaces of the fins 64 and may have facets. Subsequently, the dummy gate spacers in the PMOS region are removed (step 234), for example, by an etch, as is the mask on the NMOS region.

Gate spacers 74 are formed (step 236) on the gate seal spacers 72 along sidewalls of the dummy gates 68. The gate spacers 74 may be formed by conformally depositing a material and subsequently anisotropically etching the material. The material of the gate spacers 74 may be silicon nitride, SiCN, a combination thereof, or the like.

The epitaxial source/drain regions 76 and/or fins 64 may be implanted with dopants to form source/drain regions, similar to the process previously discussed for forming lightly doped source/drain regions, followed by an anneal (step 238). The source/drain regions may have an impurity concentration of between about $10^{19}$ cm$^{-3}$ and about $10^{21}$ cm$^{-3}$. The n-type impurities for source/drain regions in the NMOS region may be any of the n-type impurities previously discussed, and the p-type impurities for source/drain regions in the PMOS region may be any of the p-type impurities previously discussed. In other embodiments, the epitaxial source/drain regions 76 may be in situ doped during growth.

Figure 8A:
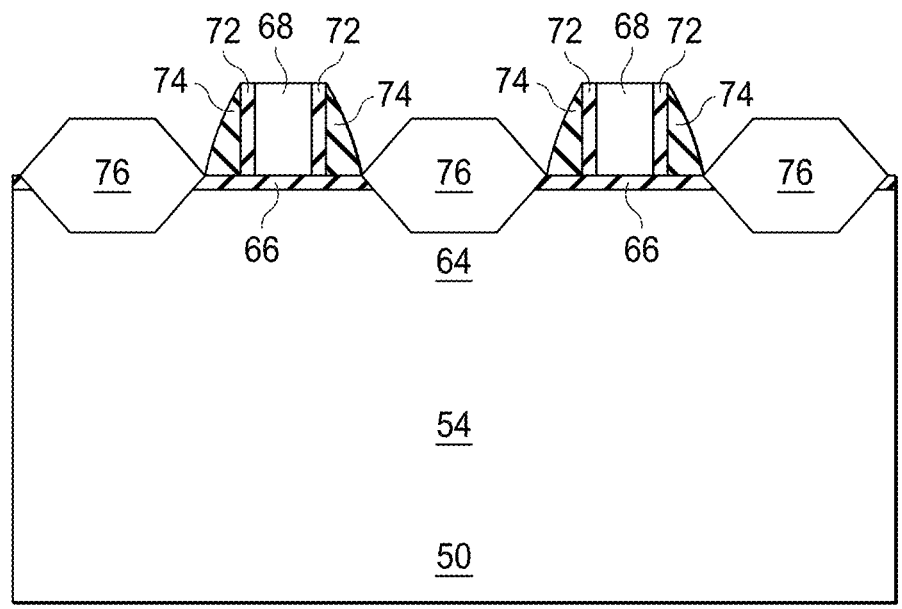
Figure 8B:
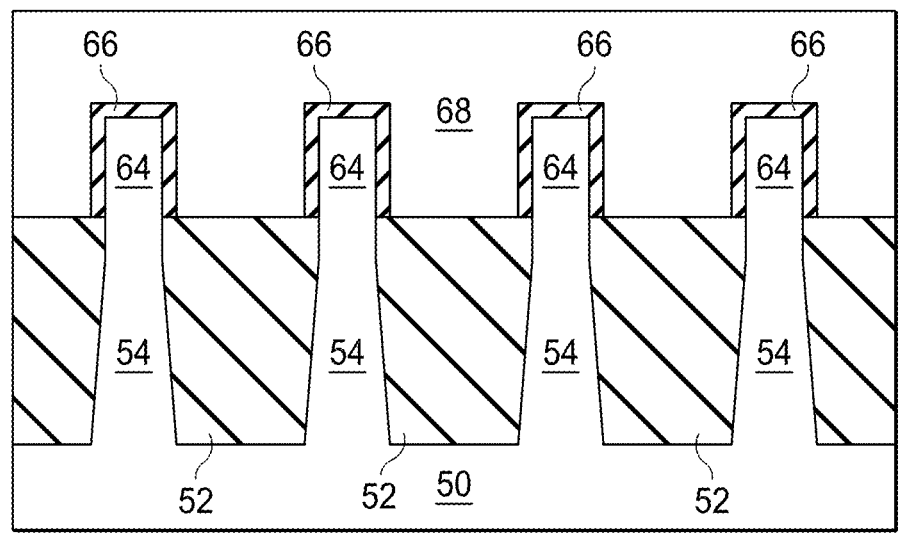

In FIGS. 8A and 8B, the masks 70 are removed (step 240), for example, by an etch selective to the material of the masks 70.

Figure 9A:
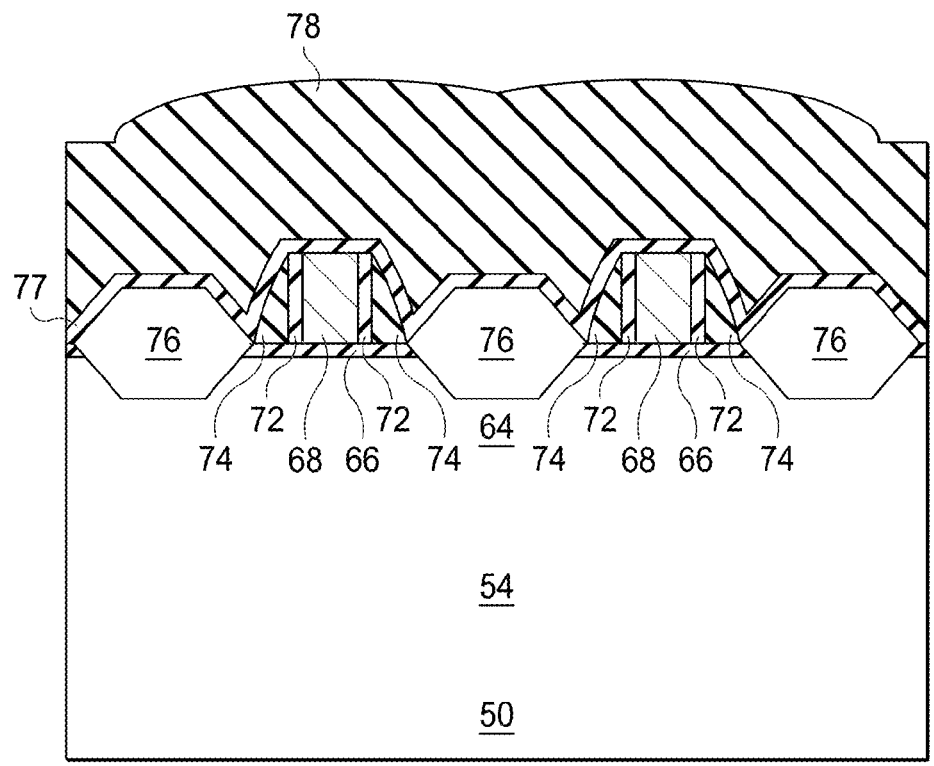
Figure 9B:
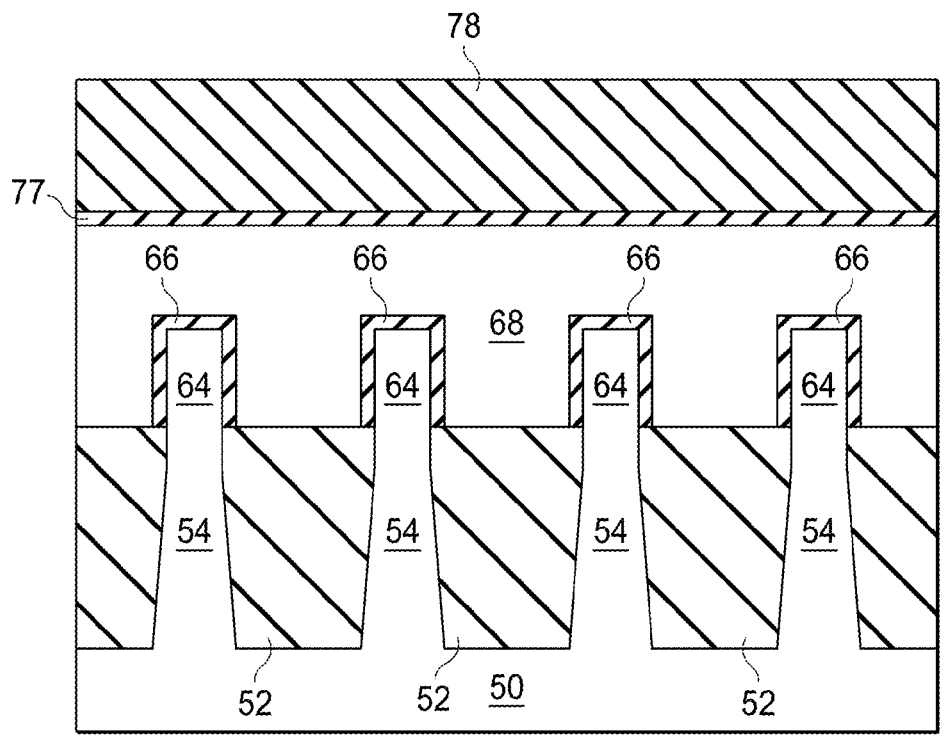

FIGS. 9A and 9B illustrate an etch stop layer 77 is conformally or non-conformally deposited (step 242) over the structure illustrated in FIGS. 8A and 8B, and an Inter-Layer Dielectric (ILD) 78 is deposited (step 244) over the etch stop layer 77. The etch stop layer 77 may be silicon nitride, SiOn, SiCN, a combination thereof, and the like. ILD 78 is formed of a dielectric material such as Phospho-Silicate Glass (PSG), Boro-Silicate Glass (BSG), Boron-Doped Phospho-Silicate Glass (BPSG), undoped Silicate Glass (USG), or the like.

Figure 10A:
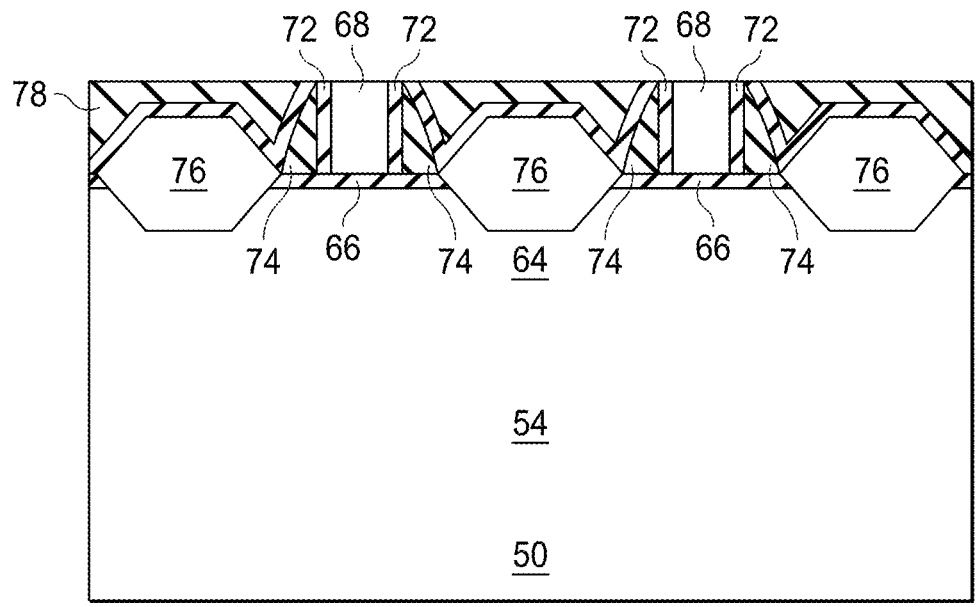
Figure 10B:
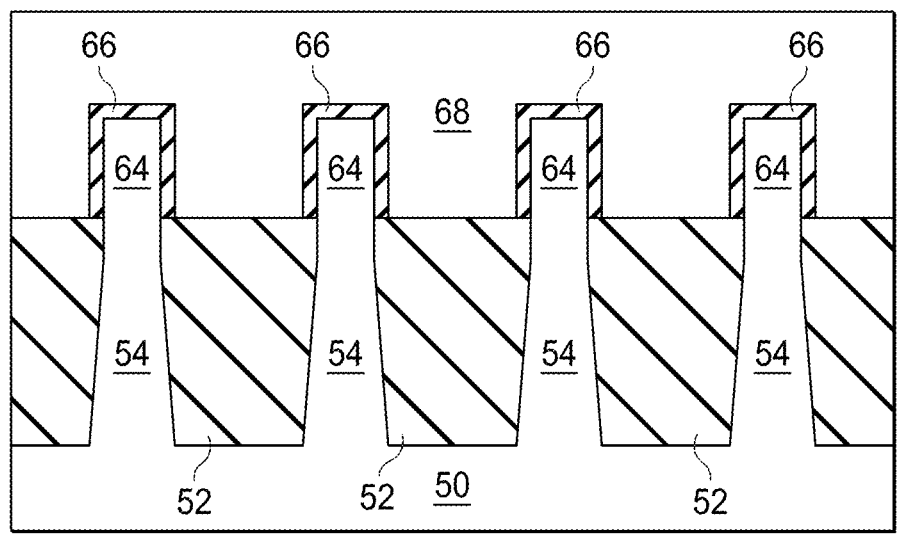

Referring to FIGS. 10A and 10B, a CMP may be performed (step 246) to level the top surface of ILD 78 with the top surfaces of the dummy gates 68. The CMP may also remove portions of the etch stop layer 77 that are directly above the dummy gates 68. Accordingly, top surfaces of the dummy gates 68 are exposed through the ILD 78 and the etch stop layer 77.

Figure 11A:
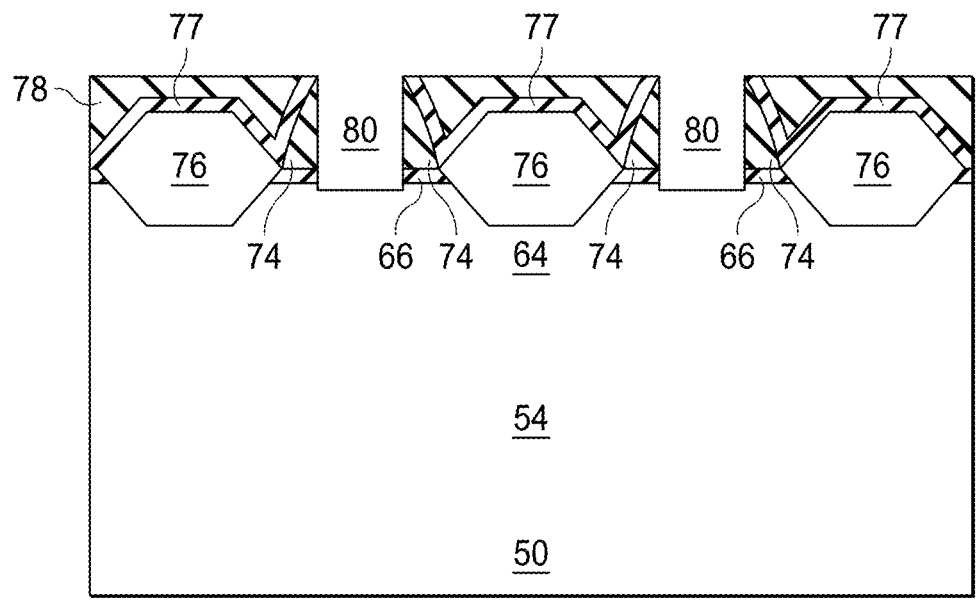
Figure 11B:
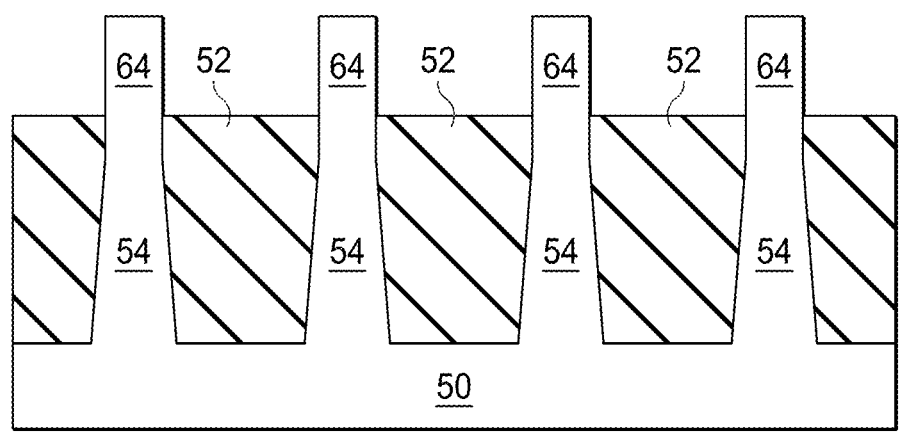

Next, referring to FIGS. 11A and 11B, the dummy gates 68, gate seal spacers 72, and portions of the dummy gate dielectric 66 directly underlying the dummy gates 68 are removed in an etching step(s), so that recesses 80 are formed. Each recess 80 exposes a channel region of a respective fin 64. Each channel region is disposed between neighboring pairs of epitaxial source/drain regions 76. During the removal, the dummy gate dielectric 66 may be used as an etch stop layer when the dummy gates 68 are etched (step 248). The dummy gate dielectric 66 and gate seal spacers 72 may then be removed (step 250) after the removal of the dummy gates 68.

Figure 12A:
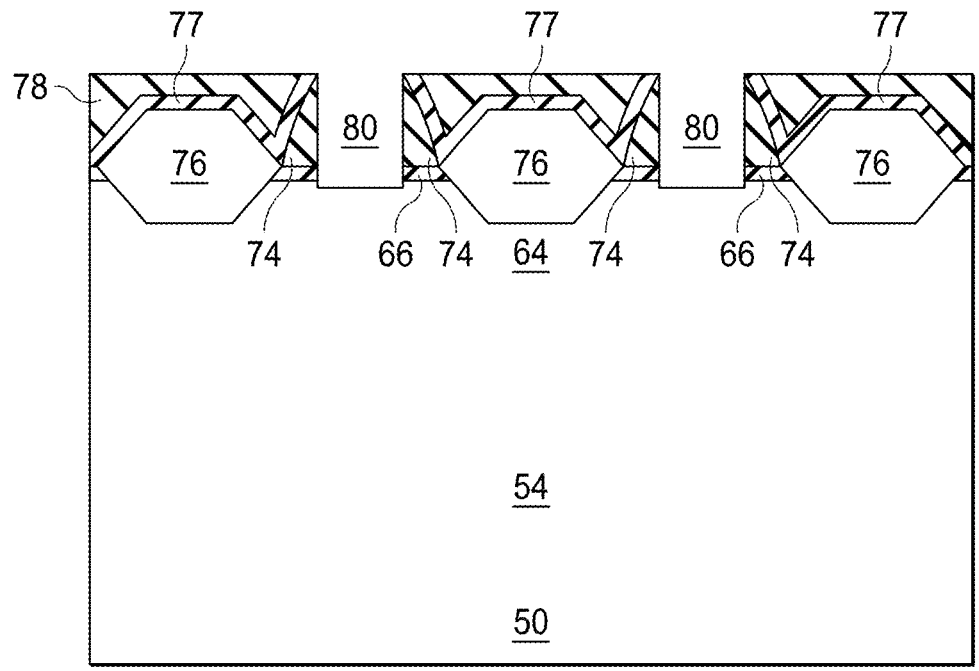
Figure 12B:
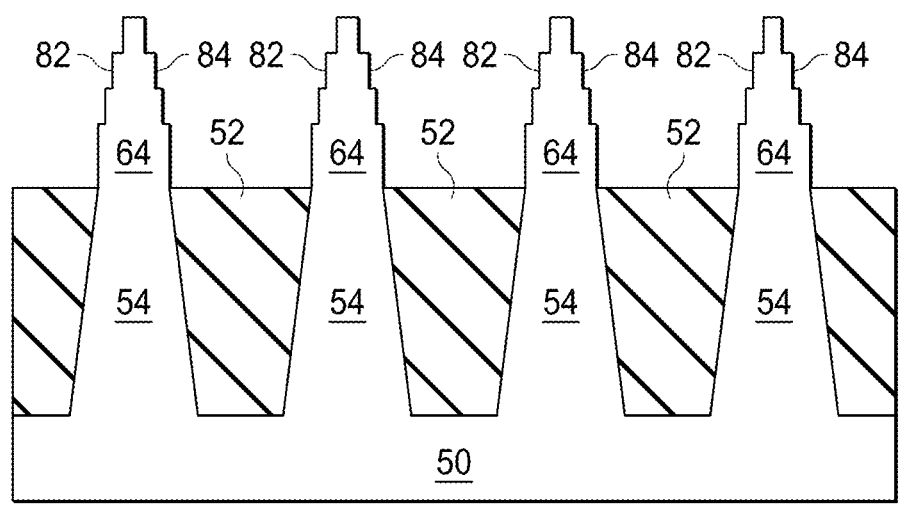

In FIGS. 12A and 12B, the channel regions of the fins 64 are re-shaped (step 252). Each channel region of the fins 64 is re-shaped to have a cross-section that intersects a longitudinal axis of the fin 64 (e.g., in a direction of current flow between the source/drain regions during operation of the finFET) that is substantially trapezoidal or triangular in shape. For example, the channel region of the fin 64 may comprise substantially a trapezoidal prism or a triangular prism. Sidewalls 82 and 84 may be respective rectangular faces of a prism, and a base of the prism may be a rectangular area disposed in the fin 64 connecting the sidewalls 82 and 84. FIG. 12B shows a stair-step illustration of the sidewalls 82 and 84. Some embodiments may have substantially smooth sidewalls 82 and 84, and other embodiments may have sidewalls 82 and 84 with more pronounced stair-step increments. Other aspects of the structure of a re-shaped fin will be discussed in more detail with respect to FIGS. 15 through 19 below.

The fin re-shaping may be performed using one or more of a wet etch, a dry etch, or an anneal. A wet etch may comprise an immersion in a solution comprising an etching species. The etching species can comprise ammonium hydroxide (NH$_4$OH), an ammonia peroxide mixture (APM), hydrochloric acid (HCl), dilute hydrofluoric acid (dHF), a combination thereof, or the like. The etching species can have a concentration between about 0.2 percent and about 20 percent in the solution. The wet etch can include immersion in the solution from about 20 seconds to about 600 seconds and can be at a temperature of about 20° C. to about 60° C. A dry etch may comprise a plasma process, such as inductively coupled plasma (ICP), transformer coupled plasma (TCP), electron cyclotron resonance (ECR), reactive ion etch (RIE), the like, or a combination thereof. The plasma process may use reaction gases including boron trichloride ($BCl_3$), chloride ($Cl_2$), hydrogen bromide (HBr), oxygen ($O_2$), the like, or a combination thereof. The plasma process may use a pressure between about 3 mTorr and about 100 mTorr, use a power of about 300 W to about 1500 W, and may use a frequency of about 2 kHz to about 13.6 MHz. An anneal may comprise heating at a temperature greater than or equal to 500° C. for about a few milliseconds, such as for a high temperature anneal at temperatures between about 800° C. and about 1200° C., to about 12 hours, such as for a lower temperature anneal at temperatures between about 500° C. and about 800° C.

FIGS. 13A and 13B illustrate the formation of gate dielectric layer 86 and gate electrodes 88. Gate dielectric layer 86 is deposited (step 254) conformally in recesses 80, such as on the top surfaces and the sidewalls of fins 64 and on sidewalls of the gate spacers 74, and on a top surface of the ILD 78. In accordance with some embodiments, gate dielectric layer 86 comprises silicon oxide, silicon nitride, or multilayers thereof. In other embodiments, gate dielectric layer 86 comprises a high-k dielectric material, and in these embodiments, gate dielectric layer 86 may have a k value greater than about 7.0, and may include a metal oxide or a silicate of Hf, Al, Zr, La, Mg, Ba, Ti, Pb, and combinations thereof. The formation methods of gate dielectric layer 86 may include Molecular-Beam Deposition (MBD), Atomic Layer Deposition (ALD), Plasma Enhanced Chemical Vapor Deposition (PECVD), and the like. Next, gate electrodes 88 are deposited (step 256) over gate dielectric layer 86, and fills the remaining portions of the recesses 80. Gate electrodes 88 may comprise a metal-containing material such as TiN, TaN, TaC, Co, Ru, Al, combinations thereof, or multilayers thereof. After the filling of gate electrodes 88, a CMP may be performed to remove the excess portions of gate dielectric layer 86 and the material of gate electrodes 88, which excess portions are over the top surface of ILD 78. The resulting remaining portions of material of gate electrodes 88 and gate dielectric layer 86 thus form replacement gates of the resulting finFETs.

Although not explicitly shown, a person having ordinary skill in the art will readily understand that further processing steps may be performed on the structure in FIGS. 13A and 13B. For example, an etch stop layer may be formed over and adjoining the gates and ILD. Inter-Metal Dielectrics (IMD) and their corresponding metallizations may be formed over the etch stop layer.

Figure 15:
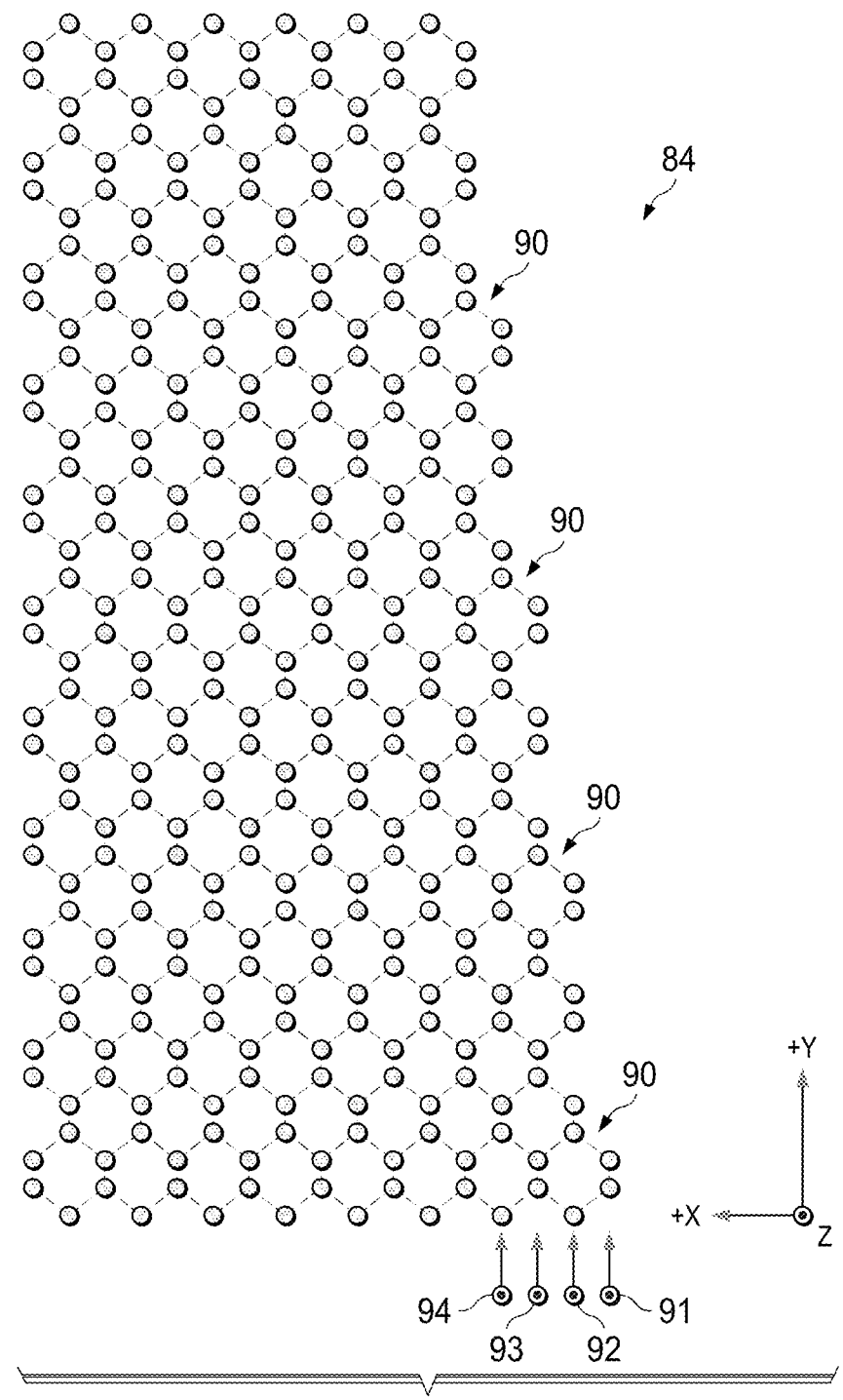
FIG. 15 is a structure of a portion of a sidewall of a fin after re-shaping according to an embodiment.

FIG. 15 illustrates a structure of a major surface portion of a sidewall 84 of a fin 64 after re-shaping. The structure shows the crystalline structure (e.g., dots being atoms and dashed lines being the lattice) of the fin 64, which may include, for example, silicon or germanium. In an embodiment, the major surface portion of the sidewall 84 of the fin 64 is a portion of the sidewall 64 between the substrate 50 and a corner, e.g. a rounded corner, at a top surface of the fin. For ease of reference, FIG. 15 includes axes X, Y, and Z. The substrate 50 is in the negative Y direction from this structure, and a top surface of the substrate 50, e.g., which may include top surfaces of STI regions 52, is in an X-Z plane.

The structure includes shift locations 90 inward toward a center of the fin 64 (e.g., in the positive X direction) along the sidewall. These shift locations 90 are places along the sidewall 84 where the exterior sidewall surface shifts inward one lattice constant. For example, shift location 90 may shift the exterior sidewall surface from a first Y-Z plane 91 to a second Y-Z plane 92, from the second Y-Z plane 92 to a third Y-Z plane 93, from the third Y-Z plane 93 to a fourth Y-Z plane 94, etc. In other embodiments, the shift may be outward from the fin 64 instead of inward. Further, the sidewall 84 may comprise any combination of inward shifts and outward shifts. The amount of the shifts 90 in the +/−X direction may be at least one lattice constant to several lattice constants, for example, the distance between neighboring pairs of the Y-Z planes 91 through 94 may be at least one lattice constant to several lattice constants. The amount of the shifts 90 in the +/−X direction may be constant between the shifts 90 or may vary between shifts 90. The distance between neighboring shifts 90 in the +/−Y direction may be any distance, such as between 2 atoms and 20 atoms in the lattice. The distances between neighboring shifts 90 in the +/−Y direction may be constant throughout the sidewall 84, e.g., may have a repeating period, or may vary.

Figure 16:
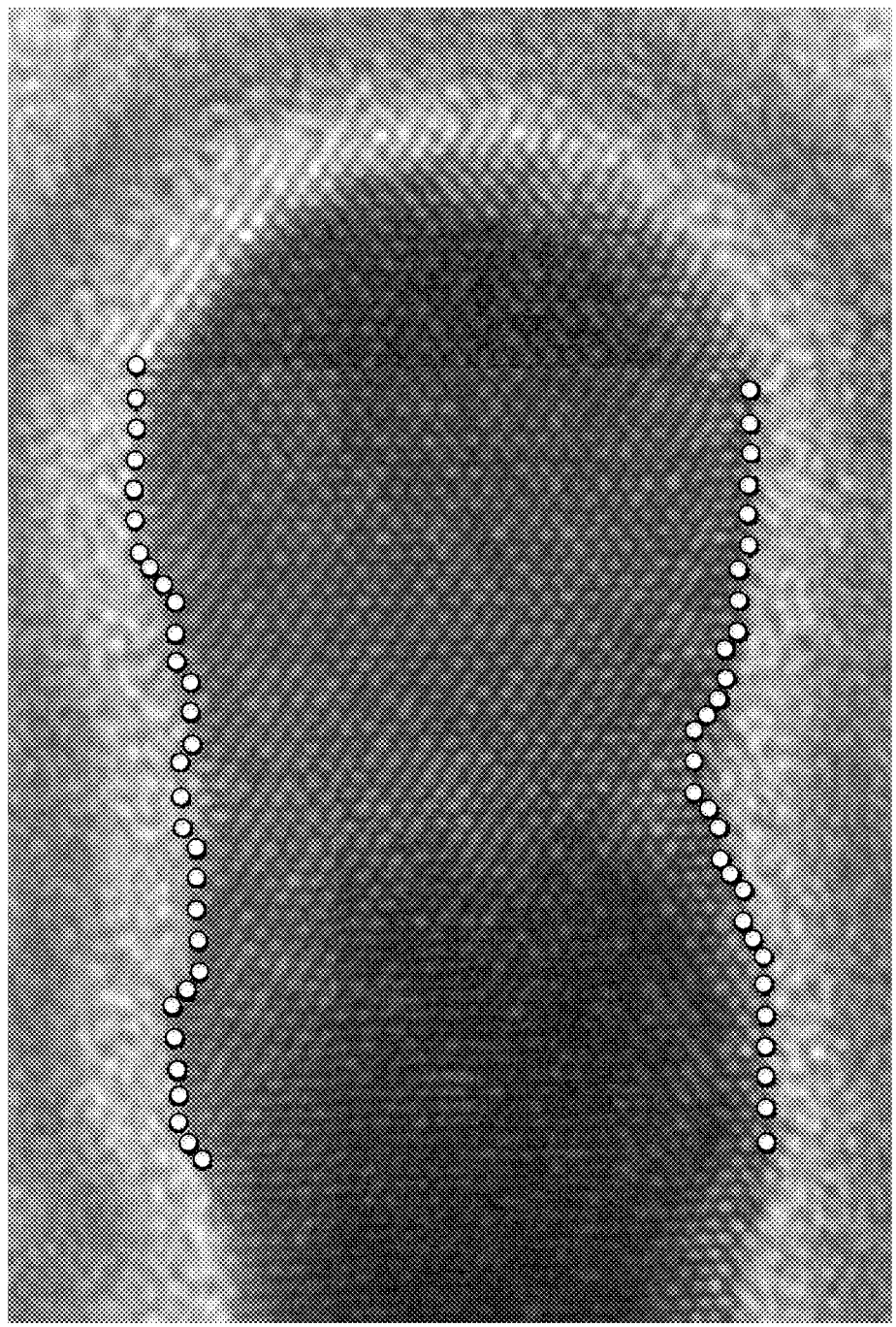
FIG. 16 is a first example of a TEM cross section of a fin that is re-shaped according to an embodiment.

FIG. 16 is a first example of a TEM cross section of a fin that is re-shaped according to an embodiment. Distinct, white markers have been added to the image to delineate atoms in the crystalline structure along the sidewalls of the fins. In this embodiment, each sidewall comprises inward shifts and outward shifts. Further, the distances between shifts vary.

Figure 17:
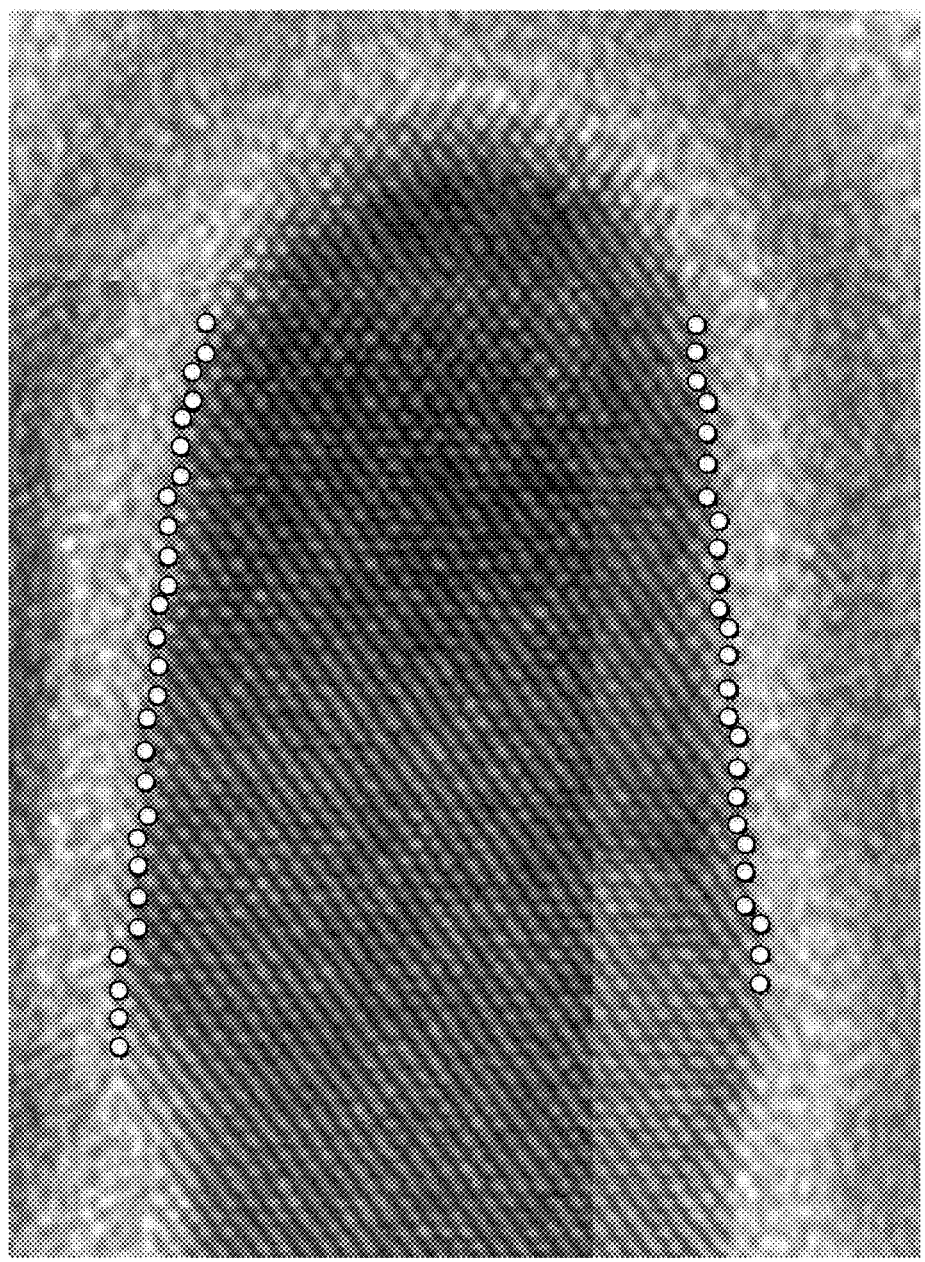
FIG. 17 is a second example of a TEM cross section of a fin that is re-shaped according to an embodiment.

FIG. 17 is a second example of a TEM cross section of a fin that is re-shaped according to an embodiment. As with FIG. 16, distinct, white markers have been added to the image to delineate atoms in the crystalline structure along the sidewalls of the fins. In this embodiment, each sidewall comprises only inward shifts. Further, the distances between shifts vary, although segments of the sidewalls have a repeating distance between shifts (e.g., 4 atoms).

Figure 18:
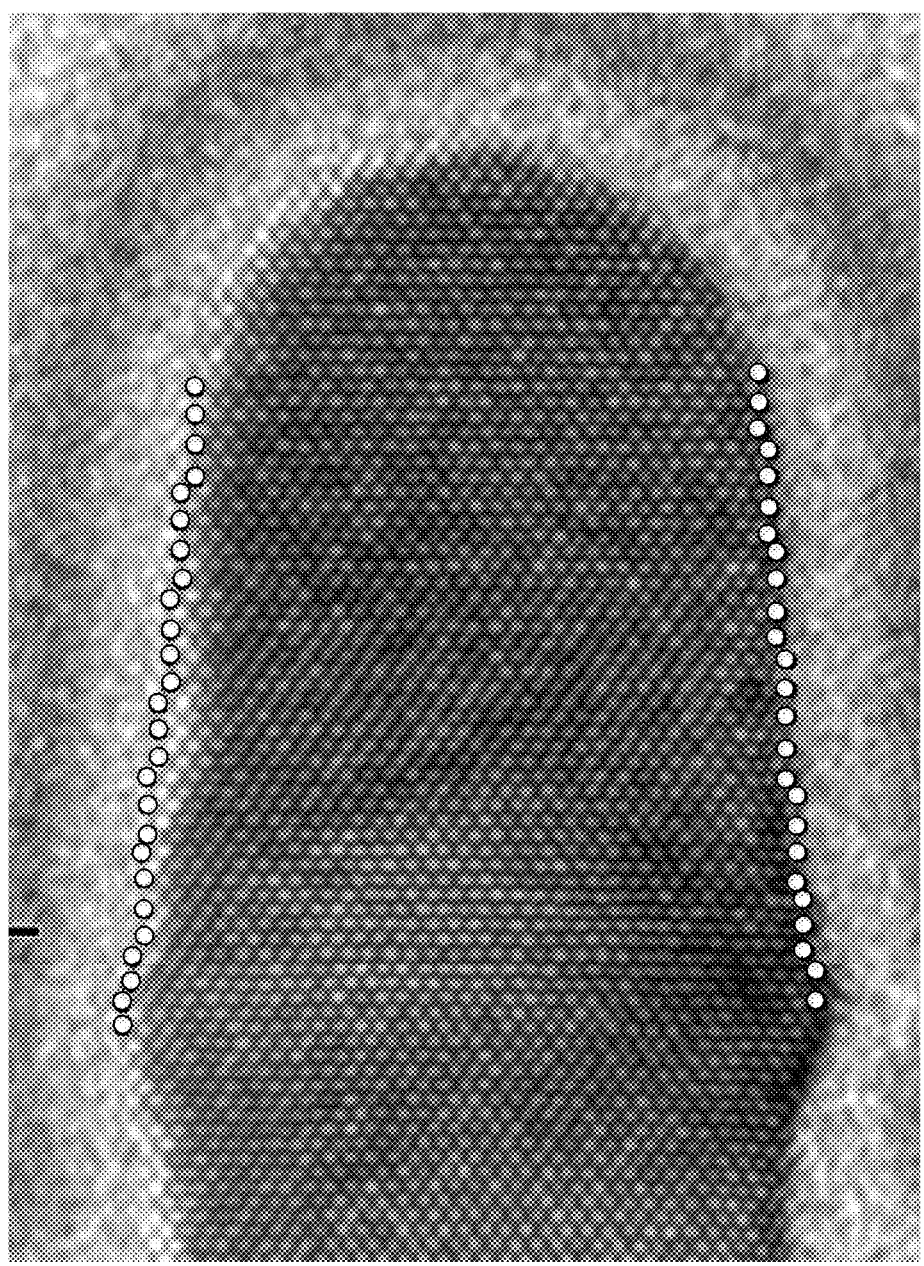
FIG. 18 is a third example of a TEM cross section of a fin that is re-shaped according to an embodiment.
Figure 19:
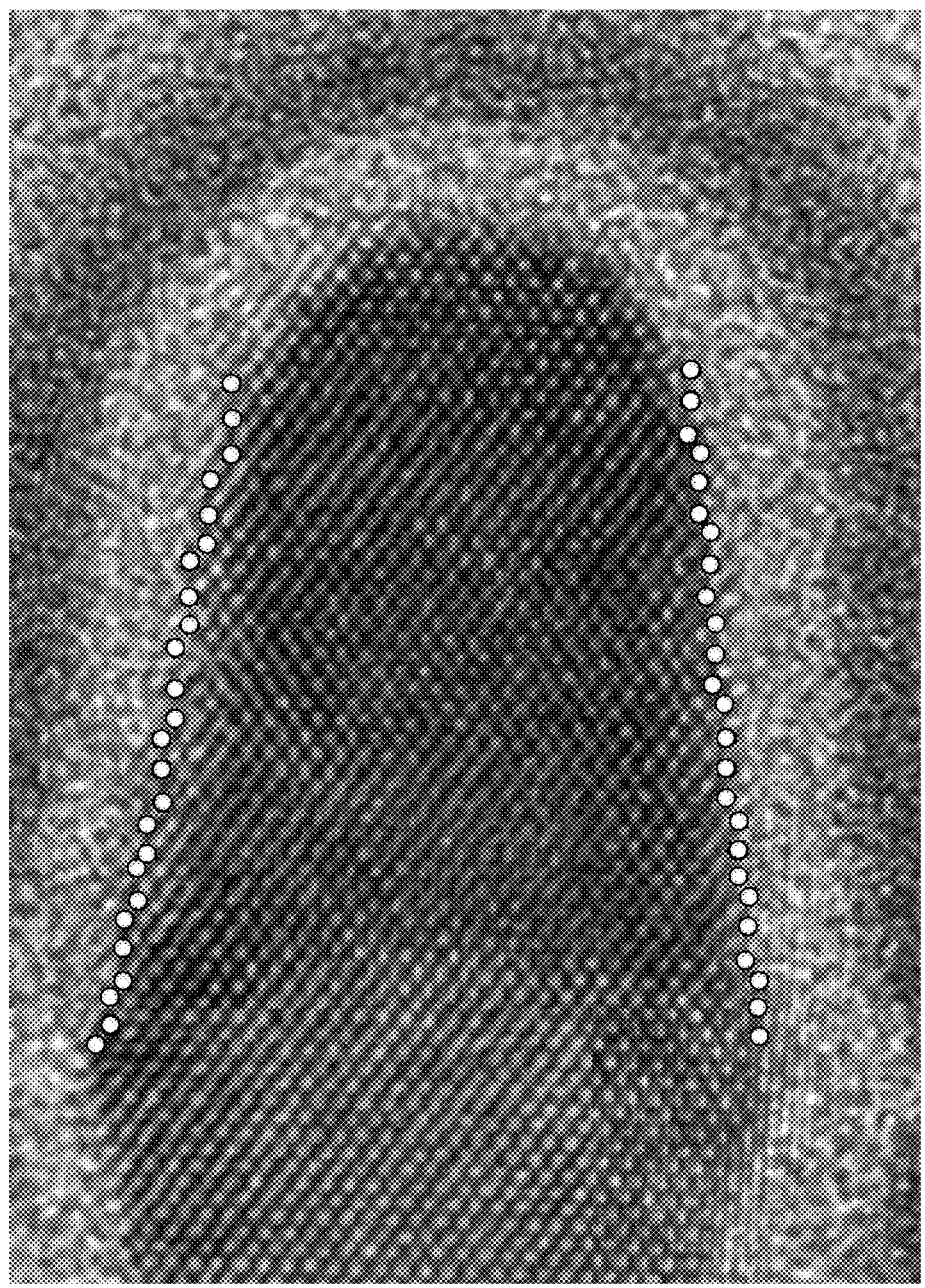
FIG. 19 is a fourth example of a TEM cross section of a fin that is re-shaped according to an embodiment.

FIGS. 18 and 19 are a third and fourth example, respectively, of TEM cross sections of fins that are re-shaped according to embodiments. As with above, distinct, white markers have been added to the images to delineate atoms in the crystalline structure along the sidewalls of the fins. These examples show other configurations of sidewalls that are contemplated within the scope of various embodiments.

Figure 23A:
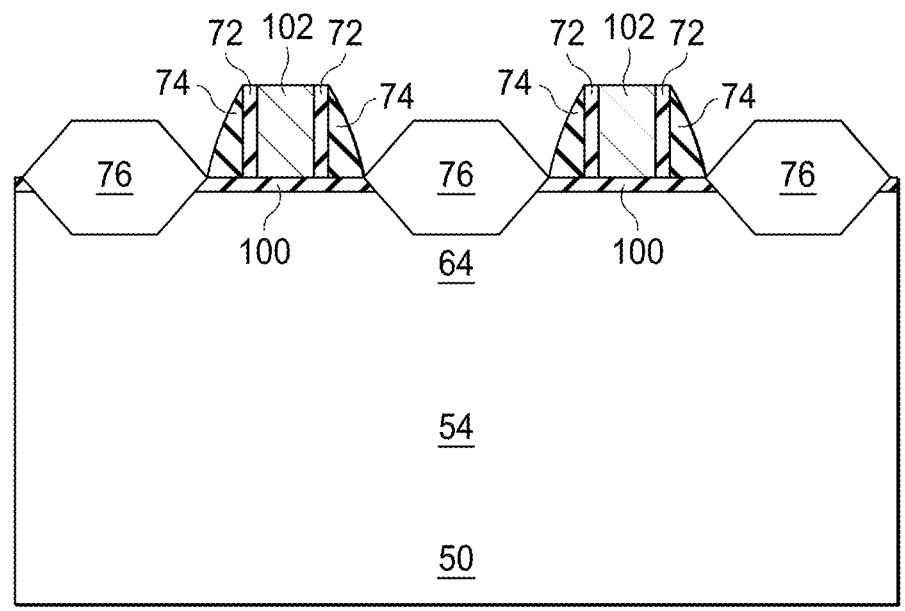
Figure 23B:
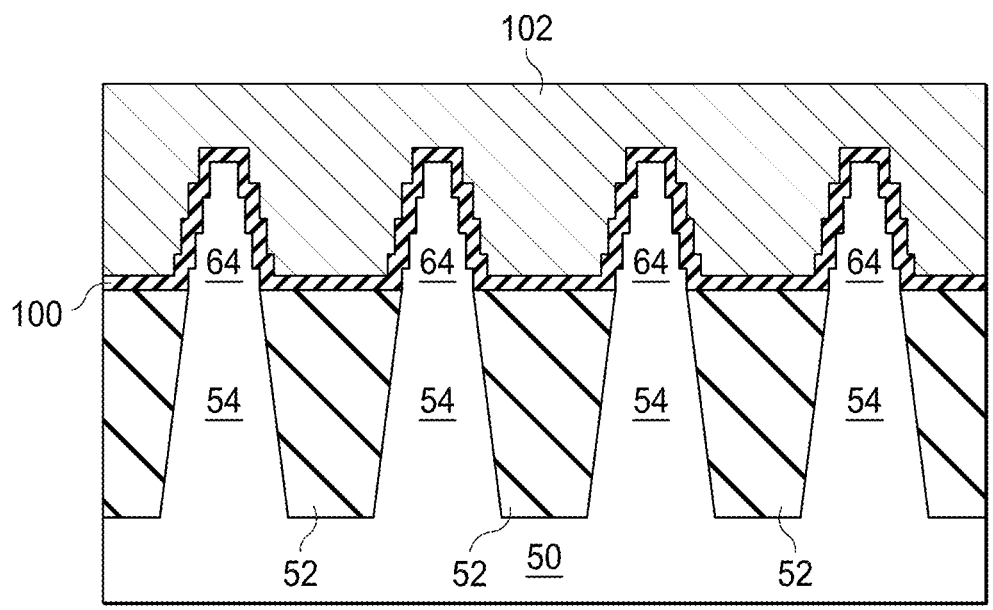
Figure 24A:
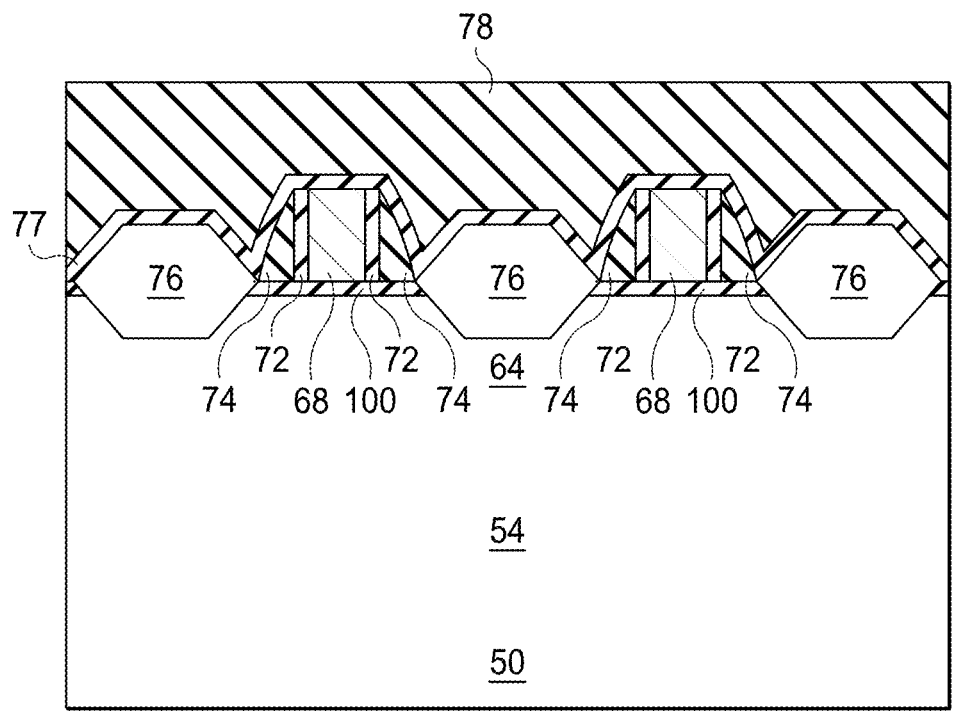
Figure 24B:
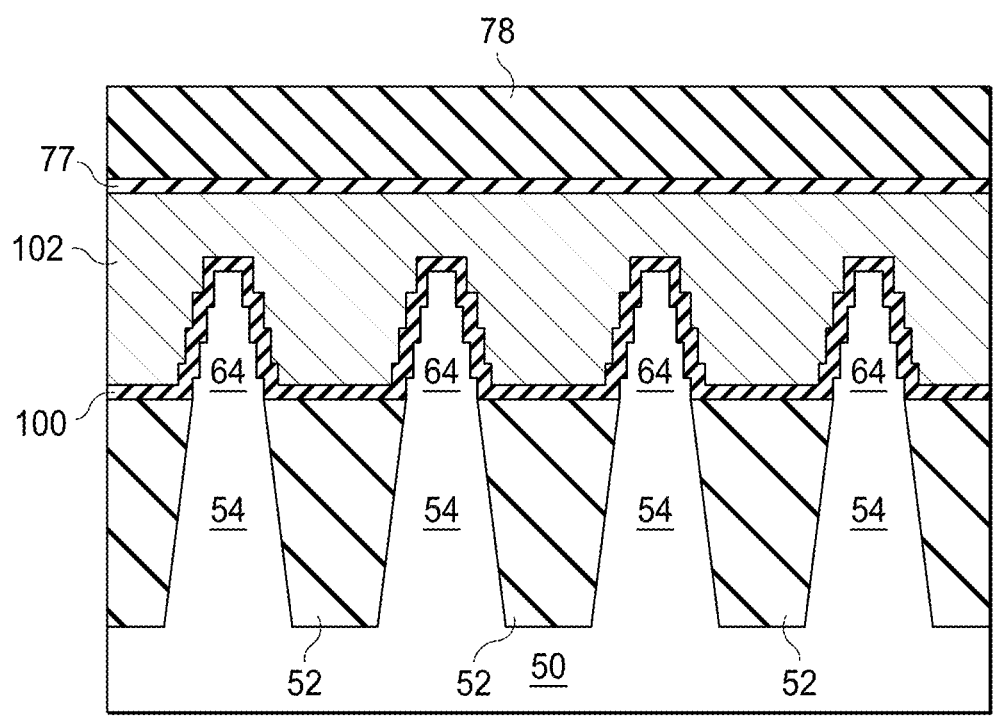
Figure 25:
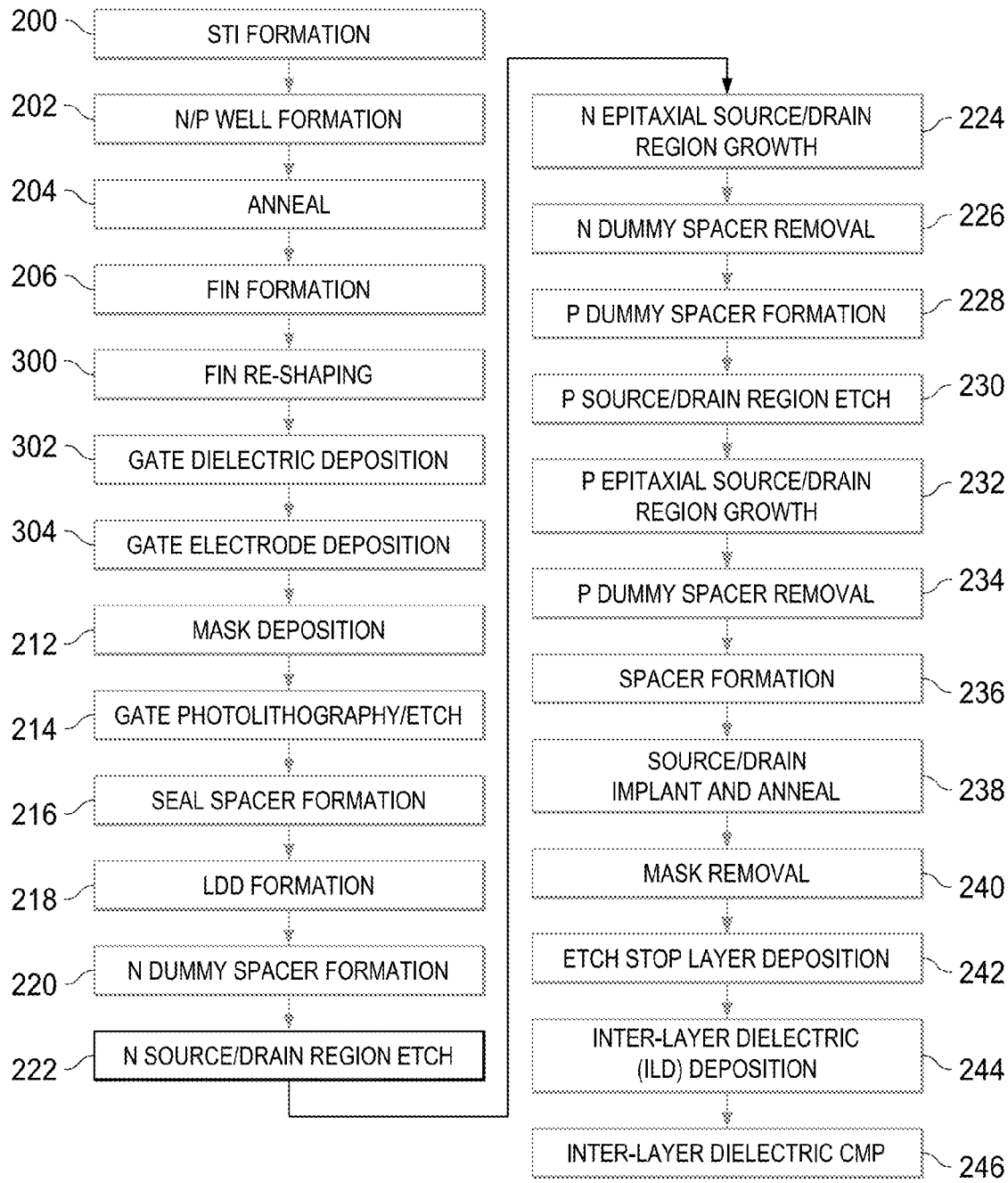
FIG. 25 is a process flow of the process shown in FIGS. 20A through 24B in accordance with another exemplary embodiment.

FIGS. 20A through 24B are cross-sectional views of intermediate stages in the manufacturing of a finFET in accordance with another exemplary embodiment, and FIG. 25 is a process flow of the process shown in FIGS. 20A through 24B. In FIGS. 20A through 24B, figures ending with an "A" designation are illustrated along a similar cross-section A-A as shown in FIG. 1, and figures ending with a "B" designation are illustrated along a similar cross-section B-B as shown in FIG. 1. The process proceeds through FIGS. 2 through 5 (steps 200 through 206) as previously discussed.

Figure 20A:
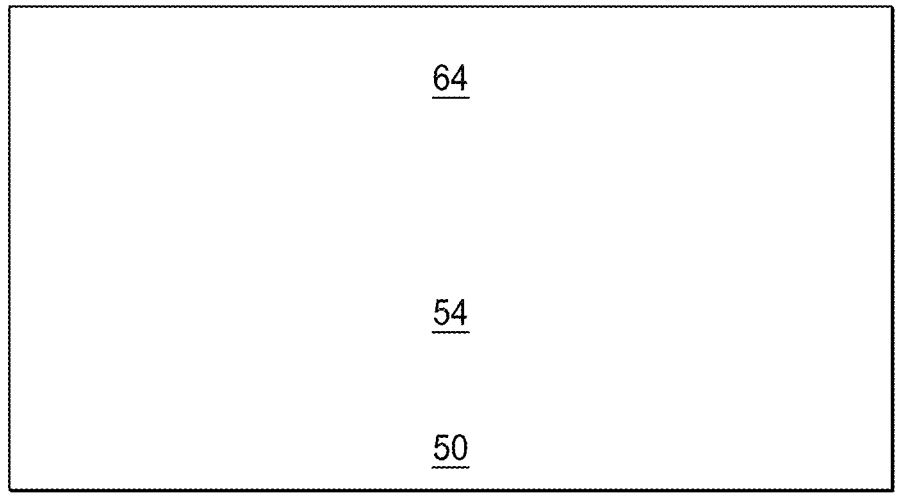
FIGS. 20A, 20B, 21A, 21B, 22A, 22B, 23A, 23B, 24A, and 24B are cross-sectional views of intermediate stages in the manufacturing of a finFET in accordance with another exemplary embodiment.
Figure 20B:
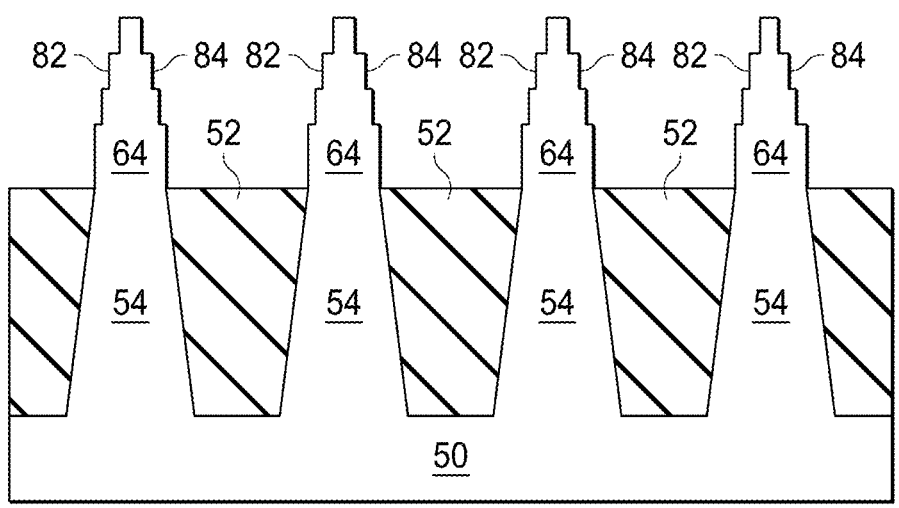

In FIGS. 20A and 20B, the fins 64 are re-shaped (step 300), as in FIGS. 12A and 12B. However, in this embodiment, because the whole of each fin 64 is exposed to the re-shaping process, the entire fin 64 may be re-shaped.

Figure 21A:
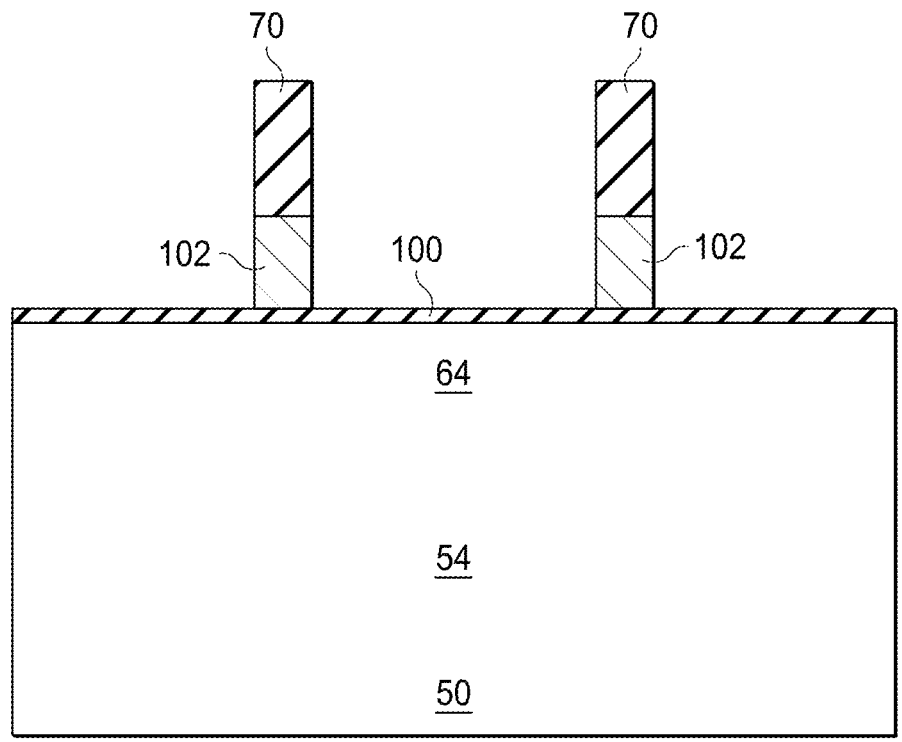
Figure 21B:
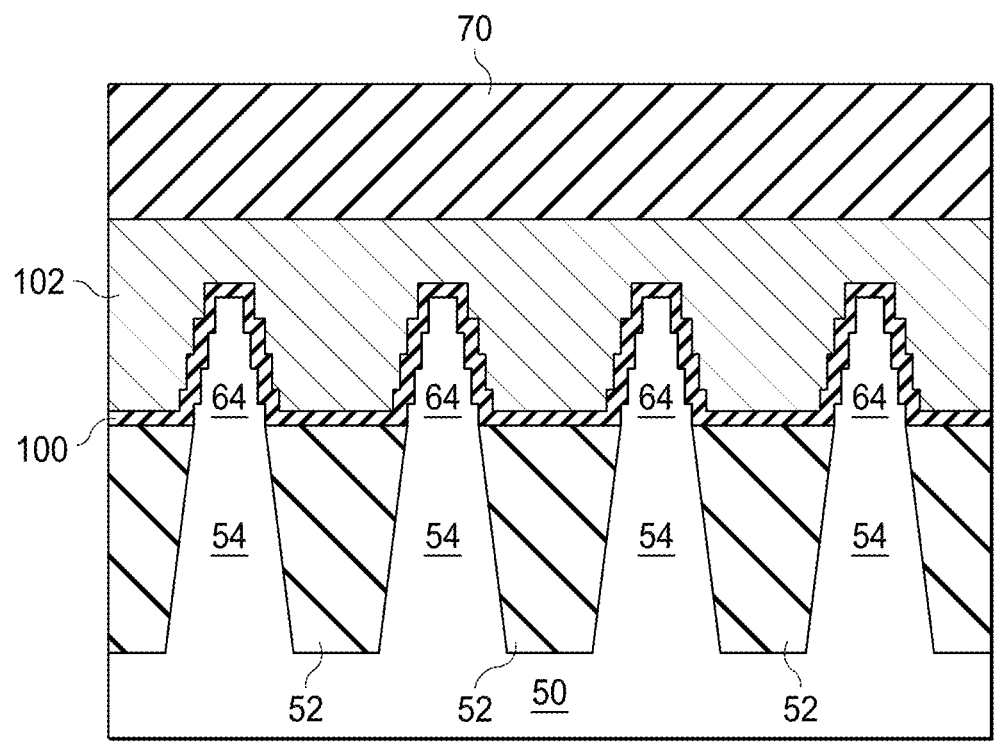

In FIGS. 21A and 21B, a gate dielectric layer 100 is deposited (step 302) on the fins 64. The gate dielectric layer 100 may be, for example, any of the materials and formed as previously discussed for gate dielectric layer 86 with respect to FIGS. 13A and 13B. A material of gate electrodes 102 is deposited (step 304) over the gate dielectric layer 100, and a material of masks 70 is deposited (step 212) over the material of gate electrodes 102. A material of the gate electrodes 102 may be deposited over the gate dielectric layer 100 and then planarized, such as by a CMP. A material of the masks 70 may be deposited over the layer of the gate electrodes 102. The material of the masks 70 then may be patterned using acceptable photolithography and etching techniques. The pattern of the masks 70 then may be transferred to the material of the gate electrodes 102 by an acceptable etching technique. These photolithography and etching techniques may form the gate electrodes 102 and masks 70 (step 214). Gate electrodes 102 may be formed of, for example, polysilicon, any material previously discussed with respect to gate electrodes 88 in FIGS. 13A and 13B, or the like. The gate electrodes 102 cover respective channel regions of the fin 64. The gate electrodes 102 may also have a lengthwise direction substantially perpendicular to the lengthwise direction of respective fins 64.

Figure 22A:
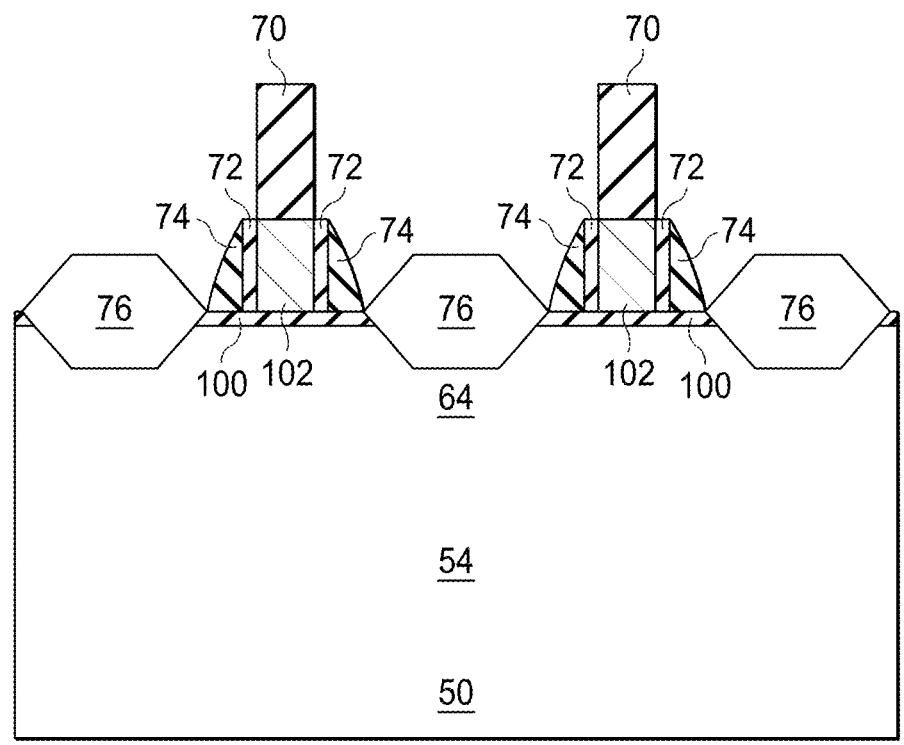
Figure 22B:
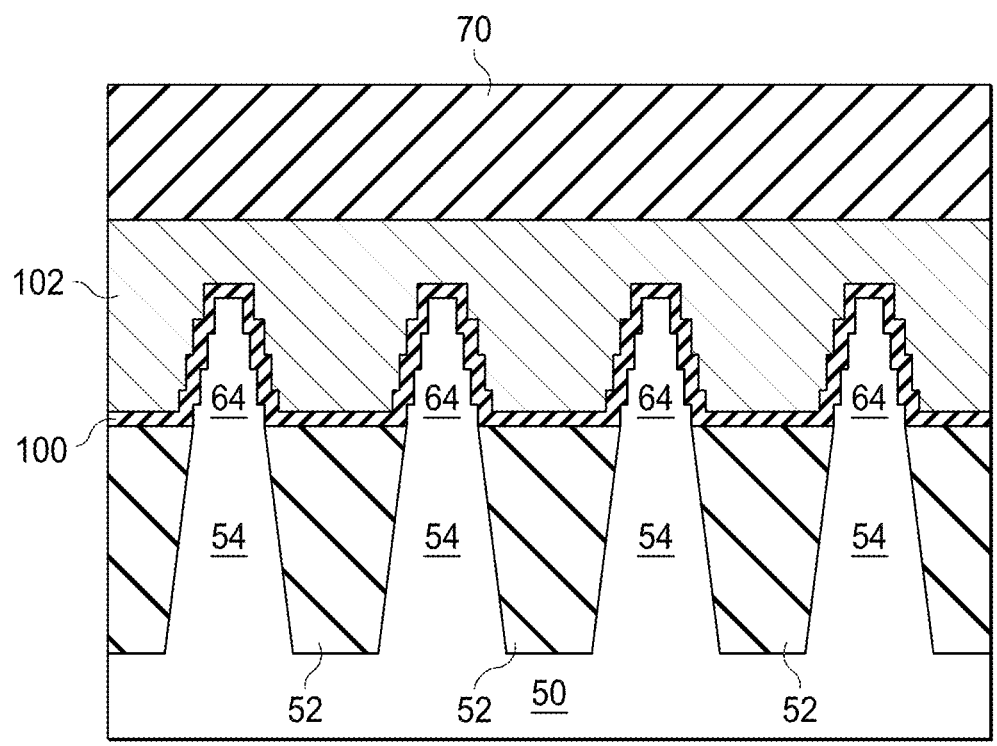

With reference to FIGS. 22A and 22B, the components therein identified are the same as or similar to similarly numbered components in FIGS. 7A and 7B, and the components in FIGS. 22A and 22B may be formed in the same or similar manner (steps 216 through 238) as discussed with respect to FIGS. 7A and 7B. Any necessary modification would be readily understood by a person having ordinary skill in the art, and thus, explicit discussion here is omitted for brevity.

In FIGS. 23A and 23B, the mask 70 is removed (step 240), similar to what was discussed in FIGS. 8A and 8B.

In FIGS. 24A and 24B, an etch stop layer 77 and ILD 78 are formed (steps 242 and 244) similar to what is discussed in FIGS. 9A and 9B. After the ILD 78 is deposited, the ILD 78 may undergo a CMP (step 246), and a portion of the ILD 78 may remain directly over the gate electrodes 102.

Various embodiments that have a re-shaped fin in a finFET may have increased electrical characteristics and performance compared to a conventional finFET. For example, it is believed that increased surface roughness can increase mobility. An increased surface roughness may increase phonon scattering, thereby increasing the mobility. Hence, in some embodiments where the fin has been re-shaped as discussed above, the finFET can have increased electrical characteristics and performance.

According to an embodiment, a method comprises forming trenches in a semiconductor substrate to form a fin, depositing an insulating material within the trenches, and removing a portion of the insulating material to expose sidewalls of the fin. The method also comprises recessing a portion of the exposed sidewalls of the fin to form a plurality of recessed surfaces on the exposed sidewalls of the fin, wherein adjacent recessed surfaces of the plurality of recessed surfaces are separated by a lattice shift. The method also comprises depositing a gate dielectric on the recessed portion of the sidewalls of the fin and depositing a gate electrode on the gate dielectric.

According to another embodiment, a method comprises forming a plurality of fins protruding from a semiconductor substrate, wherein a top surface of the plurality of fins extends farther from the substrate than a top surface of an insulating material adjacent the plurality of fins. The method also comprises reshaping first portions of the respective sidewalls of each respective fin of the plurality of fins to have a first stairstep profile, the portions extending from the top surface of the insulating material to the top surface of the respective fin. The method also comprises forming at least one gate dielectric contacting the reshaped portions of the plurality of fins and forming at least one gate electrode over the at least one gate dielectric material.

According to yet another embodiment, a method comprises forming a fin in a substrate, wherein the fin is adjacent an isolation region. The method also comprises reforming a first exposed surface of the fin into a second exposed surface, wherein the second exposed surface has greater surface roughness than the first exposed surface, wherein a channel region of the fin comprises the second exposed surface. The method also comprises forming a dielectric on the second exposed surface and forming a gate electrode on the dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming trenches in a semiconductor substrate to form a fin;
   depositing an insulating material within the trenches;
   removing a portion of the insulating material to expose sidewalls of the fin;
   recessing a portion of the exposed sidewalls of the fin to form a plurality of recessed surfaces on the exposed sidewalls of the fin, the plurality of recessed surfaces having a stairstep profile, adjacent recessed surfaces of the plurality of recessed surfaces being separated by a lattice shift;
   depositing a gate dielectric on the recessed portion of the sidewalls of the fin, the gate dielectric extending along each of the recessed surfaces of the stairstep profile; and
   depositing a gate electrode on the gate dielectric.

2. The method of claim 1, further comprising:
   forming a dummy dielectric on the fin;
   forming a dummy gate on the dummy dielectric; and
   removing the dummy gate and the dummy dielectric, the recessing being performed after removing the dummy gate and the dummy dielectric.

3. The method of claim 1, wherein the recessing comprises using a wet etch.

4. The method of claim 1, wherein the recessing comprises using a dry etch.

5. The method of claim 1, wherein the recessing comprises using an anneal.

6. The method of claim 1, wherein a portion of the adjacent recessed surfaces of the plurality of recessed surfaces are separated by multiple lattice shifts.

7. The method of claim 1, further comprising recessing a portion of a top surface of the fin.

8. A method comprising:
   forming a plurality of fins protruding from a semiconductor substrate, wherein a top surface of the plurality of fins extends farther from the semiconductor substrate than a top surface of an insulating material adjacent the plurality of fins;
   reshaping first portions of respective sidewalls of each respective fin of the plurality of fins to have a first stairstep profile, the first portions extending from the top surface of the insulating material to the top surface of the respective fin;
   forming at least one gate dielectric contacting the reshaped first portions of the plurality of fins; and
   forming at least one gate electrode over the at least one gate dielectric.

9. The method of claim 8, wherein a portion of the first stairstep profile comprises one or more lattice shifts separating adjacent planar surfaces.

10. The method of claim 8, wherein the reshaping comprises using a wet etch.

11. The method of claim 8, wherein the reshaping comprises using a dry etch.

12. The method of claim 8, wherein the reshaping comprises using an anneal.

13. The method of claim 8, wherein the reshaping also comprises reshaping second portions of the respective sidewalls of each respective fin of the plurality of fins to have a second stairstep profile.

14. A method comprising:
forming a fin in a substrate, wherein the fin is adjacent an isolation region;
reforming a first exposed surface of the fin into a second exposed surface, wherein the second exposed surface has greater surface roughness than the first exposed surface, wherein the second exposed surface has a stairstep profile, wherein a channel region of the fin comprises the second exposed surface;
forming a dielectric on the second exposed surface, the dielectric physically contacting the stairstep profile of the second exposed surface; and
forming a gate electrode on the dielectric.

15. The method of claim 14, wherein reforming the first exposed surface into a second exposed surface comprises a wet etch, a dry etch, an anneal, or a combination thereof.

16. The method of claim 14, wherein the second exposed surface of the fin extends past the channel region of the fin.

17. The method of claim 14, wherein the second exposed surface of the fin comprises a topmost surface of the fin.

18. The method of claim 14, further comprising removing a portion of the isolation region to expose the first exposed surface of the fin.

19. The method of claim 14, further comprising forming a source/drain region adjacent the channel region of the fin.

20. The method of claim 8, wherein the at least one gate dielectric extends along the first stairstep profile of the reshaped portions of each respective fin of the plurality of fins.

* * * * *